US012796520B2

(12) United States Patent
Nashida

(10) Patent No.: US 12,796,520 B2
(45) Date of Patent: Nov. 10, 2026

(54) SEMICONDUCTOR MODULE

(71) Applicant: FUJI ELECTRIC CO., LTD., Kawasaki (JP)

(72) Inventor: Norihiro Nashida, Kita-azumi-gun (JP)

(73) Assignee: FUJI ELECTRIC CO. LTD., Kawasaki (JP)

( * ) Notice: Subject to any disclaimer, the term of this patent is extended or adjusted under 35 U.S.C. 154(b) by 449 days.

(21) Appl. No.: 18/475,997

(22) Filed: Sep. 27, 2023

(65) Prior Publication Data

US 2024/0153904 A1 May 9, 2024

(30) Foreign Application Priority Data

Nov. 8, 2022 (JP) ................................ 2022-178977

(51) Int. Cl.
*H10W 72/60* (2026.01)
*H10W 72/00* (2026.01)
(Continued)

(52) U.S. Cl.
CPC ............ *H10W 72/60* (2026.01); *H10W 72/30* (2026.01); *H10W 72/621* (2026.01);
(Continued)

(58) Field of Classification Search
CPC ..................... H01L 24/37; H01L 24/40; H01L 2224/32058; H01L 2224/32227;
(Continued)

(56) References Cited

U.S. PATENT DOCUMENTS

2008/0012045 A1 1/2008 Muto et al.
2008/0197463 A1* 8/2008 Otremba ........... H01L 23/49562 257/784
(Continued)

FOREIGN PATENT DOCUMENTS

JP 2005-072098 A 3/2005
JP 2008-021796 A 1/2008
(Continued)

OTHER PUBLICATIONS

Japanese Office Action issued in counterpart Japanese Application No. 2022-178977 dated Jul. 28, 2026.

*Primary Examiner* — Alia Sabur

(57) ABSTRACT

A semiconductor module includes a first semiconductor chip including a first main electrode, a second semiconductor chip including a second main electrode, and a conductive pattern. The wiring member includes a connection portion, a first portion, a second portion, and a coupling portion. The coupling portion couples the connection portion, the first portion, and the second portion to one another. A connecting protrusion is formed on a connection surface of the connection portion. A first protrusion is formed on a first connection surface of the first portion. A second protrusion is formed on a second connection surface of the first portion. The conductive pattern and the connection surface are joined to each other by a joining material. The first main electrode and the first connection surface are joined to each other by a first joining material. The second main electrode and the second connection surface are joined to each other by a second joining material.

12 Claims, 19 Drawing Sheets

(51) Int. Cl.
*H10W 72/30* (2026.01)
*H10W 90/00* (2026.01)

(52) U.S. Cl.
CPC ........ *H10W 72/851* (2026.01); *H10W 72/886* (2026.01); *H10W 90/736* (2026.01); *H10W 90/766* (2026.01)

(58) Field of Classification Search
CPC ....... H01L 2224/37011; H01L 2224/40; H01L 23/49562; H01L 23/49524; H02M 7/003; H10W 72/60; H10W 72/621
See application file for complete search history.

(56) References Cited

U.S. PATENT DOCUMENTS

2015/0287666 A1* 10/2015 Groenhuis .............. H01L 24/37 257/676
2019/0318982 A1 10/2019 Umeda et al.

FOREIGN PATENT DOCUMENTS

JP 2021-166215 A 10/2021
WO 2017/221730 A1 12/2017
WO 2018/150556 A1 8/2018

* cited by examiner

SEMICONDUCTOR MODULE

CROSS REFERENCE TO RELATED APPLICATION

This application claims priority from Japanese Patent Application No. 2022-178977, filed Nov. 8, 2022, the entire contents of which are incorporated herein by reference.

BACKGROUND

Field of the Invention

The present disclosure relates to semiconductor modules.

A variety of types of semiconductor modules including a semiconductor chip such as an IGBT (Insulated-Gate Bipolar Transistor) have been proposed. For example, Japanese Patent Application Laid-Open Publication No. 2005-72098 discloses that a copper circuit pattern and a semiconductor chip on an insulating substrate are electrically connected to each other by a lead frame. A protrusion is formed on each of portions of the lead frame opposing the copper circuit pattern and the semiconductor chip.

In the configuration described in Japanese Patent Application Laid-Open Publication No. 2005-72098, the lead frame may be inclined in the process of manufacturing a semiconductor module. When the lead frame is inclined, the thickness of a joining material (for example, solder) for joining the lead frame to the copper circuit pattern or the semiconductor chip may not be uniform or may be insufficient.

SUMMARY

In view of the above circumstances, an object of one aspect of the present disclosure is to reduce a thickness that is not uniform or a thickness that is insufficient in a joining material caused by inclination of a wiring member.

In order to solve this problem, a semiconductor module according to one aspect of the present disclosure includes: a first semiconductor chip including a first main electrode; a second semiconductor chip including a second main electrode; a conductive pattern; and a wiring member. The wiring member includes (i) a connection portion including a connection surface opposing the conductive pattern, (ii) a first portion including a first connection surface opposing the first main electrode, (iii) a second portion including a second connection surface opposing the second main electrode, (iv) a coupling portion coupling the connection portion, the first portion, and the second portion to one another, (v) a connecting protrusion protruding from the connection surface toward the conductive pattern, (vi) a first protrusion protruding from the first connection surface toward the first main electrode, and (vii) a second protrusion protruding from the second connection surface toward the second main electrode. The conductive pattern and the connection surface are joined to each other by a joining material between the conductive pattern and the connection surface. The first main electrode and the first connection surface are joined to each other by a first joining material between the first main electrode and the first connection surface. The second main electrode and the second connection surface are joined to each other by a second joining material between the second main electrode and the second connection surface.

DESCRIPTION OF THE EMBODIMENTS

Figure 1:
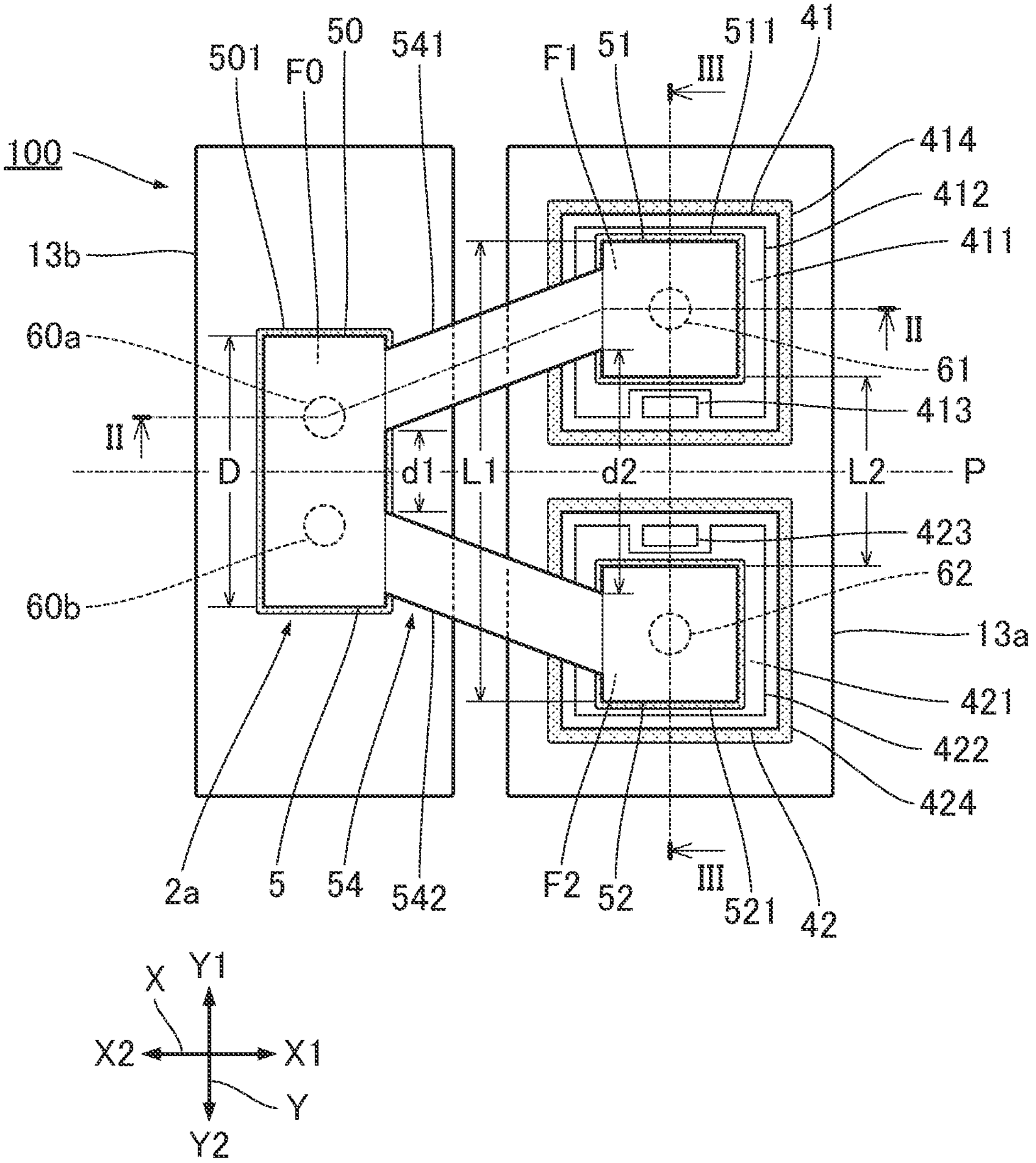
FIG. 1 is a plan view of a semiconductor module according to a first embodiment.

Embodiments for implementing the present disclosure are explained with reference to the drawings. The dimensions and scales of elements in the drawings are different from actual products as appropriate. The embodiments explained below are examples that are assumed when the present disclosure is implemented. The scope of the present disclosure is not limited to the following embodiments.

A: First Embodiment

Figure 2:
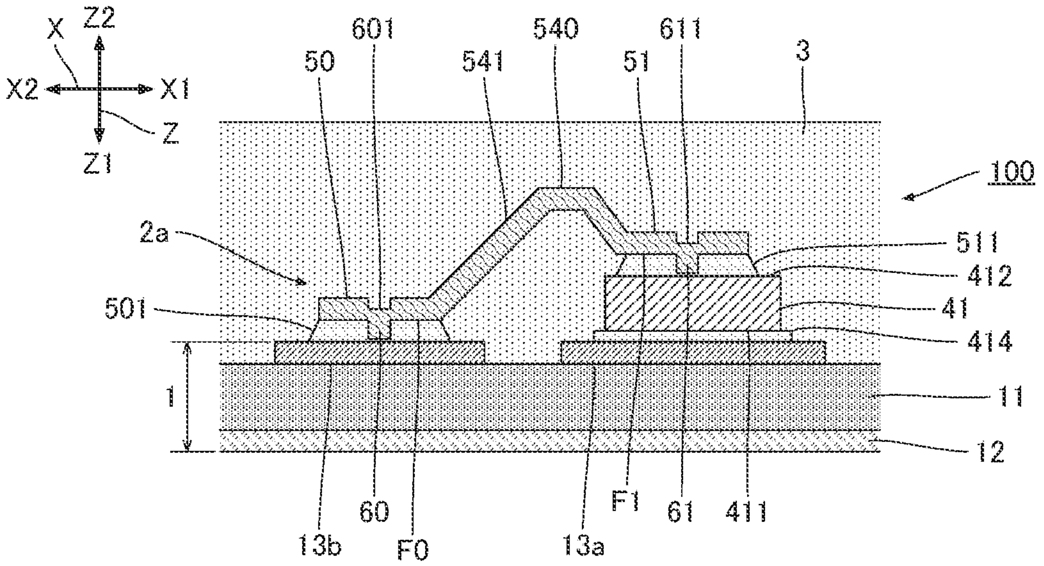
FIG. 2 is a sectional view taken along line II-II in FIG. 1.
Figure 3:
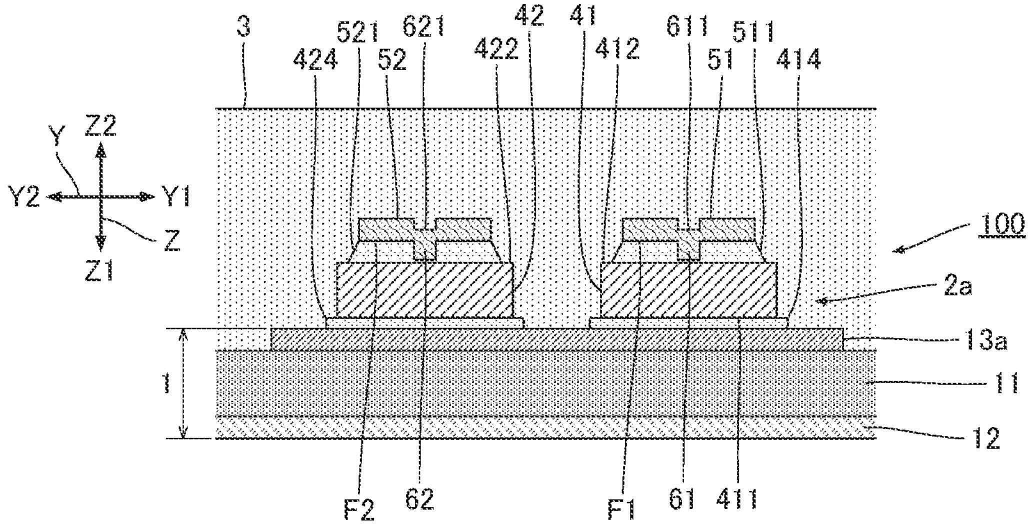
FIG. 3 is a sectional view taken along line III-III in FIG. 1.

FIG. 1 is a plan view of a semiconductor module 100 according to a first embodiment. FIG. 2 is a sectional view taken along line II-II in FIG. 1. FIG. 3 is a sectional view taken along line III-III in FIG. 1. The semiconductor module 100 of the first embodiment is, for example, a power semiconductor device that constitutes a power converter such as an inverter circuit. The semiconductor module 100 includes a mounting board 1, a semiconductor unit 2*a*, and a sealing material 3. Illustrations of the sealing material 3 are omitted in FIG. 1 for convenience sake.

In the following explanations, it is envisaged that the X-axis, the Y-axis, and the Z-axis are orthogonal to each other. One direction along the X-axis is represented by an "X1 direction", and the direction opposite to the X1 direction is represented by an "X2 direction." Similarly, one direction along the Y-axis is represented by a "Y1 direction" and the direction opposite to the Y1 direction is represented by a "Y2 direction." One direction along the Z-axis is represented by a "Z1 direction" and the direction opposite to the Z1 direction is represented by a "Z2 direction." Viewing a certain element of the semiconductor module 100 along a direction (the Z1 direction or the Z2 direction) of the Z-axis is hereinafter called a "plan view."

The semiconductor module 100 can be installed in any direction in situations of practical use. It is envisaged that the Z1 direction shows a downward direction and the Z2 direction shows an upward direction for convenience sake in the following explanations. In some cases, a surface of a certain element of the semiconductor module 100 facing the Z1 direction is represented by a "lower surface" and a surface of the element facing the Z2 direction is represented by an "upper surface."

The mounting board 1 is a wiring board on which the semiconductor unit 2*a* is mounted. Examples of the mounting board 1 include a Direct Copper Bonding (DCB) substrate, an Active Metal Brazing (AMB) substrate, and an Insulated Metal Substrate (IMS).

As illustrated in FIGS. 2 and 3, the mounting board 1 is constituted of stacked layers including an insulating substrate 11, a metallic layer 12, and conductive patterns 13 (13*a* and 13*b*). Illustrations of the insulating substrate 11 and the metallic layer 12 are omitted in FIG. 1 for convenience.

The insulating substrate 11 is a rectangular plate made of an insulating material. The insulating substrate 11 is made of a resin material such as epoxy resin. The insulating substrate 11 may be made of a ceramic material such as aluminum oxide, aluminum nitride, or silicon nitride.

The metallic layer 12 is a rectangular plate placed on the lower surface of the insulating substrate 11. The metallic layer 12 is made of a highly thermal-conductive metallic material. The material for the metallic layer 12 can be freely selected, examples of which include copper and aluminum. The surface of the metallic layer 12 is joined to a cooling mechanism (not illustrated) by a joining material such as solder. Heat generated in the semiconductor module 100 is conducted from the metallic layer 12 to the cooling mechanism. The cooling mechanism is a water-cooling mechanism that is used to cool the semiconductor module 100.

The conductive patterns 13 (13*a* and 13*b*) are plate-like or film-like conductors formed on the upper surface of the insulating substrate 11. Each of the conductive patterns 13 is made of a low-resistance conductive material. While the material for the conductive patterns 13 can be freely selected, copper and aluminum are cited as examples. The conductive pattern 13*a* and the conductive pattern 13*b* are separate from each other with a space in the X-axis direction interposed therebetween. As a result, the space between the conductive pattern 13*a* and the conductive pattern 13*b* extends in the Y-axis direction.

The semiconductor unit 2*a* is mounted on the mounting board 1. The sealing material 3 is an insulator that seals the semiconductor unit 2*a*. The entire semiconductor unit 2*a* is covered with the sealing material 3. The sealing material 3 is made of a resin such as epoxy resin. The sealing material 3 may contain various types of fillers such as silicon oxide or aluminum oxide.

The semiconductor unit 2*a* includes a semiconductor chip 41, a semiconductor chip 42, and a wiring member 5. The semiconductor chip 41 is an example of a "first semiconductor chip" and the semiconductor chip 42 is an example of a "second semiconductor chip." In the following explanations, the semiconductor chip 41 and the semiconductor chip 42 are collectively represented by "semiconductor chips 4" when it is unnecessary to distinguish between the semiconductor chip 41 and the semiconductor chip 42.

Each of the semiconductor chips 4 is a power semiconductor chip placed on the conductive pattern 13*a*. The semiconductor chip 41 is joined to the surface of the conductive pattern 13*a* by a joining material 414. The semiconductor chip 42 is joined to the surface of the conductive pattern 13*a* by a joining material 424. The joining material 414 and the joining material 424 are conductive materials such as silver paste or solder.

As illustrated in FIG. 1, the semiconductor chip 41 and the semiconductor chip 42 are arranged spaced apart from each other in the Y-axis direction. The semiconductor chip 41 and the semiconductor chip 42 are placed plane-symmetrically across a symmetry plane P. The symmetry plane P passes through the midpoint between the center of gravity of the semiconductor chip 41 and the center of gravity of the semiconductor chip 42, and is parallel to an XZ plane. The symmetry plane P is orthogonal to the following two planes (1) and (2):

(1) a plane (a YZ plane) that is orthogonal to a plane (an XY plane) parallel to the surface of the mounting board 1 and passes through two centers of gravity: the semiconductor chips 41 and 42; and (2) the plane (the XY plane) parallel to the surface of the mounting board 1.

In addition, the symmetry plane P passes through the midpoint between the center of gravity of the semiconductor chip 41 and the center of gravity of the semiconductor chip 42. The positions of the semiconductor chip 41 and the semiconductor chip 42 are examples and are appropriately changed as necessary.

Each of the semiconductor chips 4 is a switch that switches between conduction and interruption of a current. The semiconductor chips 4 in the first embodiment are, for example, MOSFETs (Metal Oxide Semiconductor Field Effect Transistors) in which SiC (silicon carbide) is used as a semiconductor material. Each of the semiconductor chips 4 is a rectangular plane about 6 millimeters on a side.

The semiconductor chip 41 includes a main electrode 411, a main electrode 412, and a control electrode 413. A current to be controlled is input to the main electrodes 411 and 412, or the current is output therefrom. The main electrode 411 is a drain electrode constituting the lower surface of the semiconductor chip 41. The main electrode 411 of the semiconductor chip 41 is joined to the conductive pattern 13*a* by the joining material 414. The main electrode 412 is a source electrode constituting the upper surface of the semiconductor chip 41. The control electrode 413 is a gate electrode to which a control voltage for controlling ON or OFF of the semiconductor chip 41 is applied, and constitutes the upper surface of the semiconductor chip 41 along with the main electrode 412. The main electrode 412 of the semiconductor chip 41 is an example of a "first main electrode."

Similarly, the semiconductor chip 42 includes a main electrode 421, a main electrode 422, and a control electrode 423. The main electrode 421 is a drain electrode constituting the lower surface of the semiconductor chip 42 and is joined to the conductive pattern 13*a* by the joining material 424. The main electrode 422 is a source electrode constituting the upper surface of the semiconductor chip 42 along with the control electrode 423. The control electrode 423 is a gate electrode to which a control voltage is applied. The main electrode 422 of the semiconductor chip 42 is an example of a "second main electrode."

The control electrode 413 of the semiconductor chip 41 is positioned in the Y2 direction of the main electrode 412 in FIG. 1. However, the positional relationship between the main electrode 412 and the control electrode 413 is not limited to the illustrated example. The control electrode 413 may be positioned in the X1 direction or the Y1 direction of the main electrode 412. Similarly, the positional relationship between the main electrode 422 and the control electrode 423 in the semiconductor chip 42 is not limited to the example illustrated in FIG. 1.

The wiring member 5 is a conductor for electrically connecting the semiconductor chip 41 and the semiconductor chip 42 to the conductive pattern 13*b*. The semiconductor chip 41 and the semiconductor chip 42 are connected in parallel to each other. The wiring member 5 is a lead frame made of a conductive plate-like member. For example, the wiring member 5 is formed by stamping a plate-like member molded into a predetermined shape. Specifically, the wiring member 5 is a structure including a connection portion 50, a first portion 51, a second portion 52, and a coupling portion 54 that are integrally formed. The wiring member 5 is formed to have a uniform thickness all over. However, the thickness of the wiring member 5 may not be uniform.

The connection portion 50 is a rectangular flat portion and overlaps the conductive pattern 13*b* in plan view. The connection portion 50 includes a lower surface (hereinafter, "connection surface F0") opposing the conductive pattern 13*b* as illustrated in FIGS. 1 and 2. The connection portion 50 is formed into a planar shape elongated in the Y-axis direction. The connection portion 50 is long in the direction in which the semiconductor chip 41 and the semiconductor chip 42 are arranged. The Y-axis direction (the Y1 direction or the Y2 direction) is an example of a "first direction."

The first portion 51 is a rectangular flat portion overlapping the semiconductor chip 41 in plan view. Specifically, the outer edge of the first portion 51 is positioned on the inside of the outer edge of the main electrode 412 of the semiconductor chip 41 in plan view. As illustrated in FIGS. 1 to 3, the first portion 51 includes a lower surface (hereinafter, "first connection surface F1") opposing the main electrode 412 of the semiconductor chip 41.

The second portion 52 is a rectangular flat portion and overlaps the semiconductor chip 42 in plan view. Specifically, the outer edge of the second portion 52 is positioned on the inside of the outer edge of the main electrode 422 of the semiconductor chip 42 in plan view. As illustrated in FIGS. 1 and 3, the second portion 52 includes a lower surface (hereinafter, "second connection surface F2") opposing the main electrode 422 of the semiconductor chip 42.

As illustrated in FIG. 1, a distance L1 between (i) an edge side of the first portion 51 positioned in the Y1 direction and (ii) an edge side of the second portion 52 positioned in the Y2 direction is larger than a dimension D of the connection portion 50 in the Y-axis direction (L1>D). A distance L2 between the first portion 51 and the second portion 52 is smaller than the dimension D of the connection portion 50 in the Y-axis direction (L2<D).

The coupling portion 54 couples the connection portion 50, the first portion 51, and the second portion 52 to each other. The coupling portion 54 extends in the X-axis direction over the conductive pattern 13*a* and the conductive pattern 13*b* in plan view. The coupling portion 54 intersects with the space between the conductive pattern 13*a* and the conductive pattern 13*b* in plan view. The coupling portion 54 in the first embodiment includes a first wiring portion 541 and a second wiring portion 542.

The first wiring portion 541 is a portion coupling the connection portion 50 and the first portion 51 to each other. The first wiring portion 541 is formed in a band shape with a predetermined width and three-dimensionally bends or curves between the connection portion 50 and the first portion 51. Specifically, the first wiring portion 541 includes a top portion 540 located at a higher position than that of the first portion 51, a portion extending obliquely upward from the first portion 51 to the top portion 540, and a portion extending obliquely downward from the top portion 540 to the connection portion 50 as illustrated in FIG. 2.

The second wiring portion 542 in FIG. 1 couples the connection portion 50 and the second portion 52 to each other. The second wiring portion 542 is formed in a band shape with a predetermined width and three-dimensionally bends or curves between the connection portion 50 and the second portion 52, in a manner similar to the first wiring portion 541.

The first wiring portion 541 and the second wiring portion 542 are coupled to the connection portion 50 at positions spaced apart from each other. Two ends, an end of the first wiring portion 541 coupled to the connection portion 50, and an end of the second wiring portion 542 coupled to the connection portion 50, are separate from each other with a predetermined distance d1 therebetween. A distance d2 between an end of the first wiring portion 541 coupled to the first portion 51 and an end of the second wiring portion 542 coupled to the second portion 52 is greater than the distance d1 between the opposite ends (d2>d1). This means that the first wiring portion 541 and the second wiring portion 542 are inclined with respect to the symmetry plane P in plan view.

As illustrated in FIGS. 1 and 2, connecting protrusions 60 (60*a* and 60*b*) are formed on the connection surface F0 of the connection portion 50 opposing the conductive pattern 13*b*. The connecting protrusions 60 are protruding in the Z1 direction from the connection surface F0 toward the conductive pattern 13*b*. Specifically, each of the connecting protrusions 60 is formed in a columnar shape with a predetermined diameter. Each of the connecting protrusions 60 is formed by stamping of a plate-like member. As a result, a recessed portion 601 corresponding to each of the connecting protrusions 60 is formed on an upper surface of the connection portion 50 opposite to the connection surface F0.

The connecting protrusions 60 (60*a* and 60*b*) are arranged spaced apart from each other in the Y-axis direction in plan view. The connecting protrusions 60 are formed at positions on the connection portion 50 corresponding to the first wiring portion 541 and the second wiring portion 542. Specifically, the connecting protrusion 60*a* is positioned near the end of the first wiring portion 541 coupled to the connection portion 50. The connecting protrusion 60*b* is positioned near the end of the second wiring portion 542 coupled to the connection portion 50.

As illustrated in FIGS. 1 and 2, the connection surface F0 of the connection portion 50 is joined to the conductive pattern 13*b* by a joining material 501. The joining material 501 is a conductor interposed between the connection surface F0 of the connection portion 50 and the surface of the conductive pattern 13*b*. A conductive material such as silver paste or solder is used as the joining material 501. Each of the connecting protrusions 60 is enclosed by the joining material 501 between the connection surface F0 and the conductive pattern 13*b*.

As illustrated in FIG. 2, the tips of the connecting protrusions 60 are close to the surface of the conductive pattern 13*b*. Specifically, the tips of the connecting protrusions 60 oppose the surface of the conductive pattern 13*b* with a sufficiently thin joining material 501 interposed therebetween. The tips of the connecting protrusions 60 may be in contact with the surface of the conductive pattern 13*b*. The distance between the connection surface F0 of the connection portion 50 and the surface of the conductive pattern 13*b* is equal to or greater than the height of the connecting protrusions 60.

As explained above, the connecting protrusions 60 are interposed between the connection surface F0 of the connection portion 50 and the surface of the conductive pattern 13*b*. As a result, the distance corresponding to the height of each of the connecting protrusions 60 is secured between the connection surface F0 of the connection portion 50 and the surface of the conductive pattern 13*b*. That is, a thickness corresponding to the height of the connecting protrusions 60 is secured for the joining material 501. The sufficient thickness secured for the joining material 501 provides the following advantages: a sufficient strength of joining between the connection portion 50 and the conductive pattern 13*b* is provided; and stress acting on the connection portion 50 is easily absorbed by the joining material 501. Thus, the connecting protrusions 60 each act as a spacer for maintaining the distance between the connection surface F0 of the connection portion 50 and the surface of the conductive pattern 13*b* at a predetermined distance (dimension).

As illustrated in FIGS. 1 to 3, one first protrusion 61 is formed on the first connection surface F1 of the first portion 51 opposing the semiconductor chip 41. The first protrusion 61 is protruding in the Z1 direction from the first connection surface F1 toward the main electrode 412 of the semiconductor chip 41. Specifically, the first protrusion 61 is formed at the center of gravity of the first connection surface F1 in plan view. The shape and dimension of the first protrusion 61 are substantially the same as those of the connecting protrusions 60. The first protrusion 61 may be formed in a columnar shape with a predetermined diameter. The first protrusion 61 is formed by stamping of a plate-like member. As a result, as illustrated in FIGS. 2 and 3, a recessed portion 611 corresponding to the first protrusion 61 is formed on an upper surface of the first portion 51 opposite to the first connection surface F1.

The first connection surface F1 of the first portion 51 is joined to the main electrode 412 of the semiconductor chip 41 by a first joining material 511. The first joining material 511 is a conductor interposed between the first connection surface F1 and the surface of the main electrode 412. A conductive material such as silver paste or solder may be used as the first joining material 511. The first protrusion 61 is enclosed by the first joining material 511 between the first connection surface F1 and the main electrode 412. The tip of the first protrusion 61 is close to or in contact with the surface of the main electrode 412 of the semiconductor chip 41. The distance between the first connection surface F1 and the main electrode 412 is equal to or greater than the height of the first protrusion 61.

As explained above, the distance corresponding to the height of the first protrusion 61 is secured between the first connection surface F1 of the first portion 51 and the surface of the main electrode 412. That is, a thickness corresponding to the height of the first protrusion 61 is secured for the first joining material 511. The sufficient thickness secured for the first joining material 511 provides the following advantages: a sufficient strength of joining between the first portion 51 and the main electrode 412 is provided; and stress acting on the first portion 51 is easily absorbed by the first joining material 511. Thus, the first protrusion 61 acts as a spacer for maintaining the distance between the first connection surface F1 of the first portion 51 and the surface of the main electrode 412 at a predetermined distance (dimension).

As illustrated in FIGS. 1 and 3, a second protrusion 62 is formed on the second connection surface F2 of the second portion 52 opposing the semiconductor chip 42. The second protrusion 62 is protruding in the Z1 direction from the second connection surface F2 toward the main electrode 422 of the semiconductor chip 42. Specifically, the second protrusion 62 is formed at the center of gravity of the second connection surface F2 in plan view. The shape and dimension of the second protrusion 62 are substantially the same as those of the connecting protrusions 60 and the first protrusion 61. For example, the second protrusion 62 is formed in a columnar shape with a predetermined diameter. The second protrusion 62 is formed by stamping of a plate-like member. As illustrated in FIG. 3, a recessed portion 621 corresponding to the second protrusion 62 is formed on an upper surface of the second portion 52 opposite to the second connection surface F2.

The second connection surface F2 of the second portion 52 is joined to the main electrode 422 of the semiconductor chip 42 by a second joining material 521. The second joining material 521 is a conductor interposed between the second connection surface F2 and the surface of the main electrode 422. A conductive material such as silver paste or solder may be used as the second joining material 521. The second protrusion 62 is enclosed by the second joining material 521 between the second connection surface F2 and the main electrode 422. The tip of the second protrusion 62 is close to or is in contact with the surface of the main electrode 422 of the semiconductor chip 42. The distance between the second connection surface F2 and the main electrode 422 is equal to or greater than the height of the second protrusion 62.

As explained above, a thickness corresponding to the height of the second protrusion 62 is secured for the second joining material 521. As a result, a sufficient strength of joining between the second portion 52 and the main electrode 422 is provided. Furthermore, stress acting on the second portion 52 is easily absorbed by the second joining material 521. Thus, the second protrusion 62 acts as a spacer for maintaining the distance between the second connection surface F2 of the second portion 52 and the surface of the main electrode 422 at a predetermined distance (dimension).

As is understood from FIG. 1, the wiring member 5 in the first embodiment has an axisymmetric shape in plan view. Specifically, the wiring member 5 is axisymmetric with respect to a symmetry axis parallel to the X-axis in plan view. The symmetry axis is parallel to the X-axis in the symmetry plane P. The state in which the wiring member 5 is "axisymmetric" includes a case in which the wiring member 5 is perfectly axisymmetric, and a case in which the wiring member 5 is substantially axisymmetric. The "case in which the wiring member 5 is substantially axisymmetric" refers to a case in which a difference from a shape (hereinafter, "virtual shape") that is virtual and is perfectly axisymmetric across a symmetry axis is within the range of manufacturing errors. For example, when an error in the dimension between the wiring member 5 and the virtual shape is ±10% (more preferably ±5%), the wiring member 5 is interpreted as being "axisymmetric."

The wiring member 5 in the first embodiment has a three-dimensional shape that is plane-symmetric across the symmetry plane P between the semiconductor chip 41 and the semiconductor chip 42. The state in which the wiring member 5 is "plane-symmetric" includes a case in which the wiring member 5 is perfectly plane-symmetric, and also a case in which the wiring member 5 is substantially plane-symmetric. The "case in which the wiring member 5 is substantially plane-symmetric" refers to a case in which deviation from a three-dimensional virtual shape (hereinafter, "virtual solid") that is perfectly plane-symmetric across the symmetry plane P is within the range of manufacturing errors. For example, when an error in the dimension between the wiring member 5 and the virtual solid is ±10% (more preferably ±5%), the wiring member 5 is interpreted as being "plane-symmetric."

Figure 4:
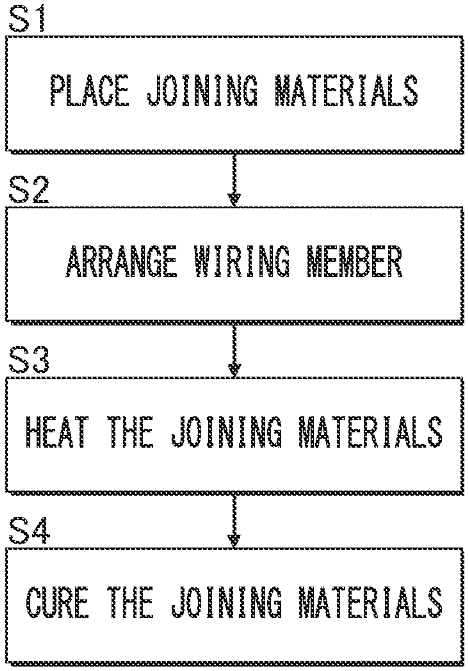
FIG. 4 is a process chart of a procedure of installing a wiring member.

FIG. 4 is a process chart of a procedure for installing the wiring member 5. First, flat plate-like joining materials (501, 511, and 521) are placed (S1). Specifically, the joining material 501 is placed on a surface of the conductive pattern 13*b*. The first joining material 511 is placed on a surface of the main electrode 412 of the semiconductor chip 41. The second joining material 521 is placed on a surface of the main electrode 422 of the semiconductor chip 42. Next, the wiring member 5 is arranged (S2). Specifically, the wiring member 5 is supported by a jig in such a manner that the following (i) to (iii) are met: (i) the connection portion 50 is positioned on a surface of the joining material 501; (ii) the first portion 51 is positioned on a surface of the first joining material 511; and (iii) the second portion 52 is positioned on a surface of the second joining material 521.

In such a state, the joining materials are melted by heating (S3). For example, the joining materials are heated to a high temperature of about 300° C. The wiring member 5 moves down due to melting of the joining materials. Specifically, the connecting protrusions 60 penetrate inside the joining material 501. The first protrusion 61 penetrates inside the first joining material 511. The second protrusion 62 penetrates inside the second joining material 521. In such a state, the joining materials are cured (S4). The wiring member 5 is fixed by curing of the joining materials. The procedure for installing the wiring member 5 is as described above.

Figure 5:
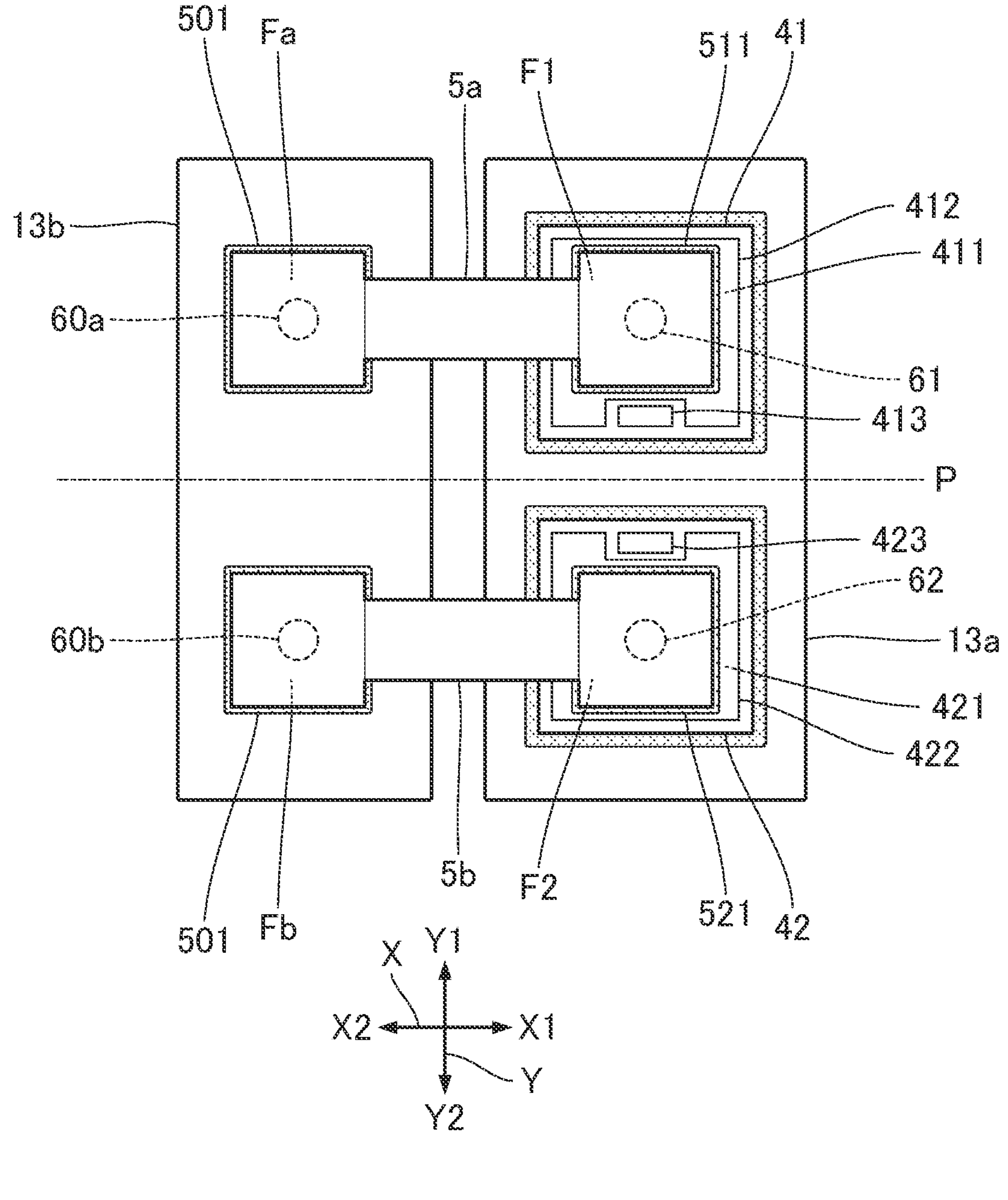
FIG. 5 is a plan view of a semiconductor module in a comparative example.

As a configuration in which the main electrode 412 of the semiconductor chip 41 and the main electrode 422 of the semiconductor chip 42 are electrically connected to the conductive pattern 13*b*, for example, a mode (hereinafter, "Comparative Example") illustrated in FIG. 5 is also conceivable. The comparative example shows that the wiring member 5 in the first embodiment is replaced by a wiring member 5*a* and a wiring member 5*b*. The wiring member 5*a* and the wiring member 5*b* are constituted of bodies different from each other.

The wiring member 5*a* is a lead frame electrically connecting the main electrode 412 of the semiconductor chip 41 to the conductive pattern 13*b*. One connecting protrusion 60*a* is formed on a connection surface Fa of the wiring member 5*a* opposing the conductive pattern 13*b*. The connection surface Fa is joined to the conductive pattern 13*b* by the joining material 501. One first protrusion 61 is formed on the first connection surface F1 of the wiring member 5*a* opposing the main electrode 412 of the semiconductor chip 41. The first connection surface F1 is joined to the main electrode 412 by the first joining material 511.

Similarly, the wiring member 5*b* is a lead frame electrically connecting the main electrode 422 of the semiconductor chip 42 to the conductive pattern 13*b*. One connecting protrusion 60*b* is formed on a connection surface Fb of the wiring member 5*b*, which is joined to the conductive pattern 13*b* by the joining material 501. One second protrusion 62 is formed on the second connection surface F2 of the wiring member 5*a*, which is joined to the main electrode 422 by the second joining material 521.

In the comparative example, the wiring member 5*a* is supported by the two protrusions (60*a* and 61). As a result, in the course of melting the joining materials in the manufacturing process, the orientation of the wiring member 5*a* is not stable. There is a possibility that the wiring member 5*a* will be inclined with respect to a design orientation. If the joining materials (501 and 511) are cured in a state in which the wiring member 5*a* is inclined, the thicknesses of the joining materials may not be uniform, resulting in a partially insufficient thickness of the joining materials. At a portion at which the thickness of the joining materials is insufficient, the strength of joining may be insufficient. Alternatively, stress may not be sufficiently absorbed by the joining materials. Although description is given of the wiring member 5*a*, the same problem may be anticipated for the wiring member 5*b*.

If first protrusions 61 are formed on the first connection surface F1 of the wiring member 5*a* in the Comparative Example, the wiring member 5*a* is supported at three or more points and inclination is suppressed. However, if the semiconductor chip 41 is small, it is difficult to secure a region for forming the first protrusions 61 on the first connection surface F1 of the wiring member 5*a*. The same holds true for the wiring member 5*b*.

In contrast to the comparative example, the following are provided on the wiring member 5 in the first embodiment: the connecting protrusions 60 protruding toward the conductive pattern 13*b*; the first protrusion 61 protruding toward the main electrode 412 of the semiconductor chip 41; and the second protrusion 62 protruding toward the main electrode 422 of the semiconductor chip 42. Thus, the wiring member 5 is supported at three or more points. As a result, even when the number of the first protrusion 61 or the second protrusion 62 is small, the orientation of the wiring member 5 is stably maintained. That is, the probability of inclination of the wiring member with respect to the designed orientation can be decreased. Thicknesses of the joining materials (501, 511, and 521) may not be uniform due to inclination of the wiring member 5 can be suppressed.

Particularly in the first embodiment, since the wiring member 5 is axisymmetric, the orientation of the wiring member 5 is more likely to be stably maintained as compared to a case in which the wiring member 5 has an asymmetric shape. As a result, the effect described above that the thicknesses of the joining materials may not be uniform caused by inclination of the wiring member 5 can be suppressed is significantly prominent. Furthermore, the wiring member 5 is plane-symmetric in the first embodiment. With this configuration, since the center of gravity of the wiring member 5 is in the symmetry plane P, the orientation of the wiring member 5 is more likely to be stably maintained as compared to the mode in which the wiring member 5 has an asymmetric shape. As a result, the effect described above that thicknesses of the joining materials not being uniform caused by inclination of the wiring member 5 can be suppressed is significantly prominent.

In the first embodiment, the connecting protrusions 60 are provided on the connection surface F0 of the connection portion 50. As a result, the orientation of the wiring member 5 is more likely to be stably maintained than in a mode in which only one connecting protrusion 60 is provided on the connection surface F0. The effect described above that the thicknesses of the joining materials (501, 511, and 521) not being uniform caused by inclination of the wiring member 5 can be suppressed is significantly prominent. Particularly in the first embodiment, the connecting protrusions 60 (60*a* and 60*b*) are arranged spaced apart from each other in the longitudinal direction of the connection portion 50. As a result, the orientation of the wiring member is more likely to be stably maintained than in a mode in which the connecting protrusions 60 are arranged in the X direction. The effect that the thicknesses of the joining materials not being uniform caused by inclination of the wiring member 5 can be suppressed is significantly prominent.

In the first embodiment, the first protrusion 61 is formed on the first connection surface F1, and the second protrusion 62 is formed on the second connection surface F2. Even when the semiconductor chip 41 or the semiconductor chip 42 is small, the area of the joining by means of the joining materials (the first joining material 511 and the second joining material 521) can be more easily secured than in the following cases: (i) first protrusions 61 are formed on the first connection surface F1; and (ii) second protrusions 62 are formed on the second connection surface F2.

B: Second Embodiment

A second embodiment of the present disclosure is explained. In respective modes exemplified below, elements having substantially the same function as those described in the first embodiment are denoted by the reference signs used in the explanations of the first embodiment, and respective detailed explanations thereof are omitted as appropriate.

Figure 6:
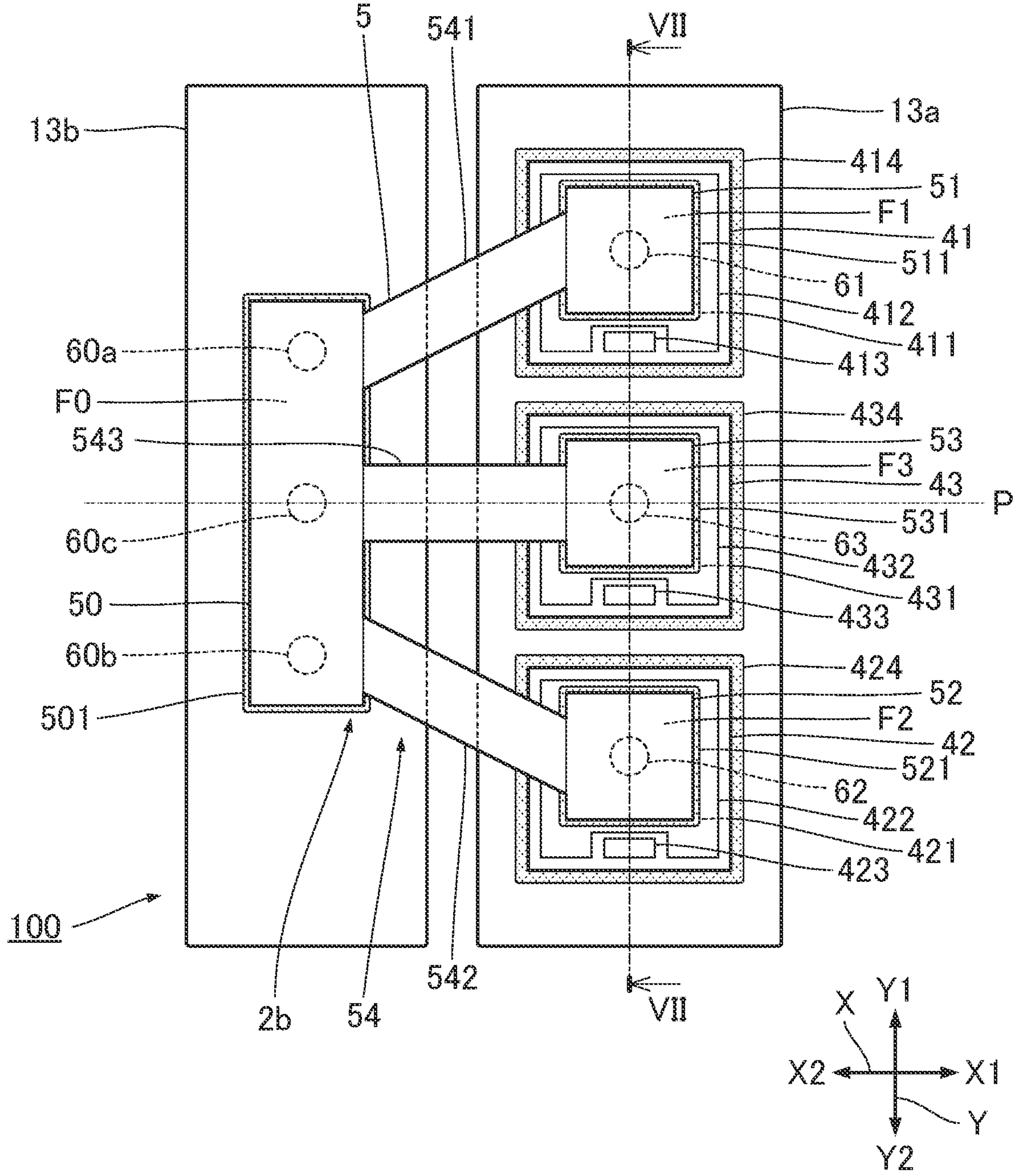
FIG. 6 is a plan view of a semiconductor module in a second embodiment.
Figure 7:
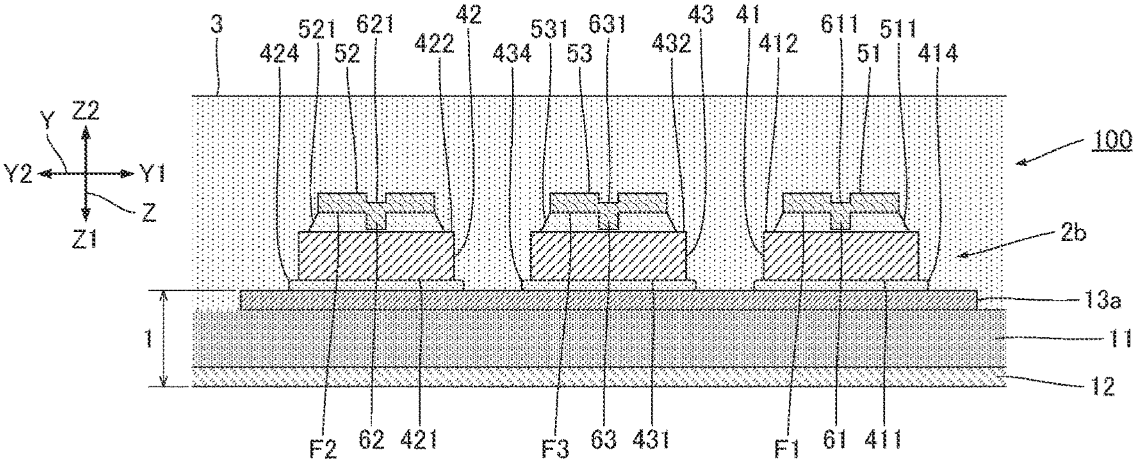
FIG. 7 is a sectional view taken along line VII-VII in FIG. 6.

FIG. 6 is a plan view of the semiconductor module 100 in the second embodiment. FIG. 7 is a sectional view taken along line VII-VII in FIG. 6. As illustrated in FIGS. 6 and 7, a semiconductor unit 2*b* in the second embodiment includes three semiconductor chips 4 (41, 42, and 43) and the wiring member 5. The three semiconductor chips 4 are arranged spaced apart from each other in the Y-axis direction. Specifically, the semiconductor chip 43 is positioned between the semiconductor chip 41 and the semiconductor chip 42. The three semiconductor chips 4 are placed plane-symmetrically across the symmetry plane P. The mounting board 1 and the sealing material 3 are substantially the same as those in the first embodiment. The positions of the three semiconductor chips 4 (41, 42, and 43) are merely an example and may be appropriately altered as necessary.

The configurations of the semiconductor chips 4 (41, 42, and 43) are substantially the same as those in the first embodiment. The semiconductor chip 41 includes the main electrode 411, the main electrode 412, and the control electrode 413. The semiconductor chip 42 includes the main electrode 421, the main electrode 422, and the control electrode 423. The semiconductor chip 43 similarly includes a main electrode 431, a main electrode 432, and a control electrode 433. The main electrode 431 is a drain electrode constituting the lower surface of the semiconductor chip 43. The main electrode 432 is a source electrode constituting the upper surface of the semiconductor chip 43. The control electrode 433 is a gate electrode constituting the upper surface of the semiconductor chip 43 along with the main electrode 432. The semiconductor chip 43 is an example of a “third semiconductor chip” and the main electrode 432 is an example of a “third main electrode.”

The wiring member 5 is a conductor for electrically connecting the semiconductor chips 4 (41, 42, and 43) to the conductive pattern 13*b*. The semiconductor chip 41, the semiconductor chip 42, and the semiconductor chip 43 are connected in parallel to each other. The wiring member 5 in the second embodiment is a structure including the connection portion 50, the first portion 51, the second portion 52, a third portion 53, and the coupling portion 54 integrally formed.

The connection portion 50 is a rectangular flat portion and overlaps the conductive pattern 13*b* in plan view, in a manner similar to that in the first embodiment. Three connecting protrusions 60 (60*a*, 60*b*, and 60*c*) respectively corresponding to the different semiconductor chips 4 (41, 42, and 43) are formed on the connection surface F0 of the connection portion 50 opposing the conductive pattern 13*b*. The connecting protrusions 60 are protruding in the Z1 direction from the connection surface F0 toward the conductive pattern 13*b*. Specifically, each of the connecting protrusions 60 is formed in a column shape with a predetermined diameter by stamping of a plate-like member, in a manner similar to that in the first embodiment. The connecting protrusions 60 (60*a*, 60*b*, and 60*c*) are arranged spaced apart from each other in the Y-axis direction in plan view.

In a manner similar to that in the first embodiment, the first portion 51 includes the first connection surface F1 opposing the main electrode 412 of the semiconductor chip 41. The second portion 52 includes the second connection surface F2 opposing the main electrode 422 of the semiconductor chip 42. The first protrusion 61 is formed on the first connection surface F1. The second protrusion 62 is formed on the second connection surface F2.

As illustrated in FIGS. 6 and 7, the third portion 53 is a rectangular flat portion and overlaps the semiconductor chip 43 in plan view. Specifically, the outer edge of the third portion 53 is positioned on the inside of the outer edge of the main electrode 432 of the semiconductor chip 43 in plan view. As a result, the third portion 53 includes a lower surface (hereinafter, “third connection surface F3”) opposing the main electrode 432 of the semiconductor chip 43. The third portion 53 is positioned between the first portion 51 and the second portion 52 in plan view. The first portion 51, the second portion 52, and the third portion 53 are arranged spaced apart from each other in the Y-axis direction.

One third protrusion 63 is formed on the third connection surface F3 of the third portion 53. The third protrusion 63 is protruding in the Z1 direction from the third connection surface F3 toward the main electrode 432 of the semiconductor chip 43. Specifically, the third protrusion 63 is formed at the center of gravity of the third connection surface F3 in plan view. The shape and dimension of the third protrusion 63 are substantially the same as those of the first protrusion 61 and the second protrusion 62. For example, the third protrusion 63 is formed in a columnar shape with a predetermined diameter. The third protrusion 63 is formed by stamping of a plate-like member. As illustrated in FIG. 7, a recessed portion 631 corresponding to the third protrusion 63 is formed on an upper surface of the third portion 53 opposite to the third connection surface F3.

The third connection surface F3 of the third portion 53 is joined to the main electrode 432 of the semiconductor chip 43 by a third joining material 531. The third joining material 531 is a conductor interposed between the third connection surface F3 and the surface of the main electrode 432. For example, a conductive material such as silver paste or solder is used as the third joining material 531. The third protrusion 63 is enclosed by the third joining material 531 between the third connection surface F3 and the main electrode 432. The tip of the third protrusion 63 is close to or is in contact with the surface of the main electrode 432 of the semiconductor chip 43.

As illustrated in FIG. 6, the coupling portion 54 in the second embodiment includes a third wiring portion 543 in addition to the first wiring portion 541 and the second wiring portion 542 that are substantially the same as those in the first embodiment. The third wiring portion 543 extends in the X-axis direction between the first wiring portion 541 and the second wiring portion 542. Specifically, the third wiring portion 543 is formed in a band shape with a predetermined width and bends or curves in three dimensions between the connection portion 50 and the third portion 53, in a manner similar to the first wiring portion 541 and the second wiring portion 542.

The first wiring portion 541, the second wiring portion 542, and the third wiring portion 543 are coupled to the connection portion 50 at positions spaced apart from each other. That is, the following ends are separate from each other with a predetermined space therebetween: (i) an end of the first wiring portion 541 coupled to the connection portion 50; (ii) an end of the second wiring portion 542 coupled to the connection portion 50; and (iii) an end of the third wiring portion 543 coupled to the connection portion 50. The connecting protrusion 60*a* is positioned close to the end of the first wiring portion 541. The connecting protrusion 60*b* is positioned close to the end of the second wiring portion 542. The connecting protrusion 60*c* is positioned close to the end of the third wiring portion 543.

Thus, the wiring member 5 in the second embodiment has an axisymmetric shape in plan view. Specifically, the wiring member 5 is axisymmetric in plan view with respect to a symmetry axis parallel to the X-axis. Furthermore, the wiring member 5 in the second embodiment has a three-dimensional shape that is plane-symmetric across the symmetry plane P. The center of gravity of the wiring member 5 is positioned on the symmetry plane P.

The same effects as those of the first embodiment can also be realized in the second embodiment. Since the three semiconductor chips 4 are connected in parallel in the second embodiment, a larger current can be controlled as compared to a mode (the first embodiment) in which two semiconductor chips 4 are connected in parallel.

C: Third Embodiment

In a third embodiment, description will be given of usage examples of the semiconductor unit 2*a* in the first embodiment and the semiconductor unit 2*b* in the second embodiment. As illustrated in FIGS. 8 to 13, the mounting board 1 in the third embodiment is a wiring board that includes a conductive pattern 13*p*, a conductive pattern 13*n*, a conductive pattern 13*o*, a control wiring 13*g*1, and a control wiring 13*g*2. These patterns and wirings are formed on the upper surface of the insulating substrate 11.

A power terminal 81 is connected to the conductive pattern 13*p*. A power voltage on a higher side is supplied to the power terminal 81 from an external power source. A power terminal 82 is connected to the conductive pattern 13*n*. A power voltage on a lower side is supplied to the power terminal 82 from an external power source. An output terminal 83 is connected to the conductive pattern 13*o*. The output terminal 83 is a connection terminal for supplying power to, for example, a load device such as a motor. The conductive pattern 13*o* is positioned between the conductive pattern 13*p* and the conductive pattern 13*n* in plan view.

A control voltage for controlling ON or OFF of each of the semiconductor chips 4 is supplied from a drive circuit (not illustrated) to the control wiring 13*g*1 and the control wiring 13*g*2. The conductive pattern 13*p* is positioned between the control wiring 13*g*1 and the conductive pattern 13*o*. The conductive pattern 13*n* is positioned between the control wiring 13*g*2 and the conductive pattern 13*o*.

As illustrated in FIGS. 8 to 13, the semiconductor module 100 includes an upper arm portion A1 and a lower arm portion A2. The upper arm portion A1 is a switch that switches between conduction and insulation of the conductive pattern 13*p* and the conductive pattern 13*o*. The lower arm portion A2 is a switch that switches between conduction and insulation of the conductive pattern 13*o* and the conductive pattern 13*n*.

Mode 1

Figure 8:
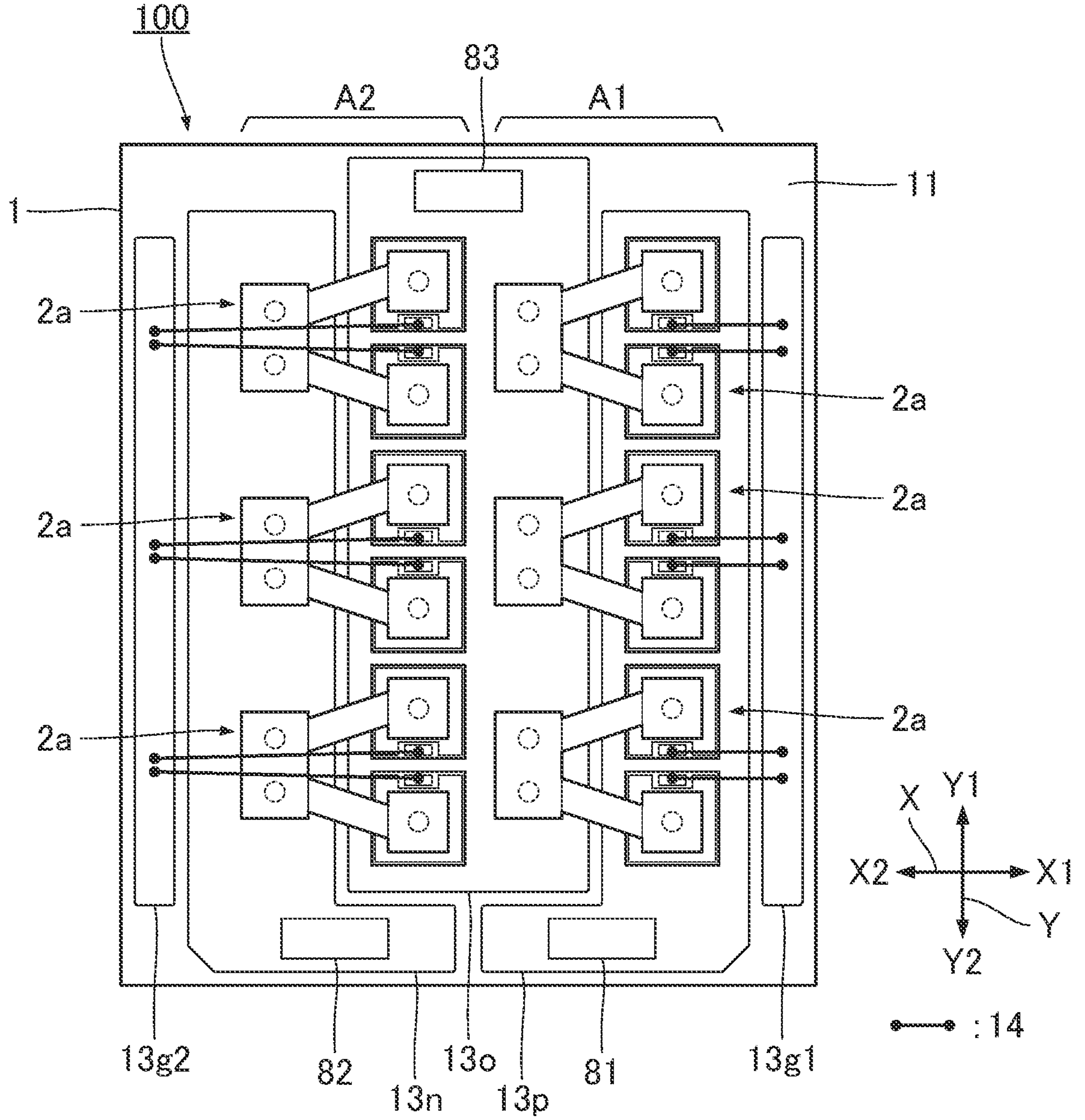
FIG. 8 is a plan view of a semiconductor module in Mode 1 of a third embodiment.

In Mode 1 illustrated in FIG. 8, each of the upper arm portion A1 and the lower arm portion A2 is constituted of three semiconductor units 2*a* described in the first embodiment. Each of the upper arm portion A1 and the lower arm portion A2 includes six semiconductor chips 4 connected in parallel to each other. The control electrodes (413 and 423) in each of the semiconductor chips 4 of the upper arm portion A1 are, for example, electrically connected to the control wiring 13*g*1 with wires 14. The control electrodes (413 and 423) in each of the semiconductor chips 4 of the lower arm portion A2 are, for example, electrically connected to the control wiring 13*g*2 with wires 14.

The first portion 51 and the second portion 52 in each of the semiconductor units 2*a* of the upper arm portion A1 are joined to the conductive pattern 13*p*. The following are joined to the conductive pattern 13*o*: (i) the connection portion 50 in each of the semiconductor units 2*a* of the upper arm portion A1; and (ii) the first portion 51 and the second portion 52 in each of the semiconductor units 2*a* of the lower arm portion A2. The connection portion 50 in each of the semiconductor units 2*a* of the lower arm portion A2 is joined to the conductive pattern 13*n*.

Mode 2

Figure 9:
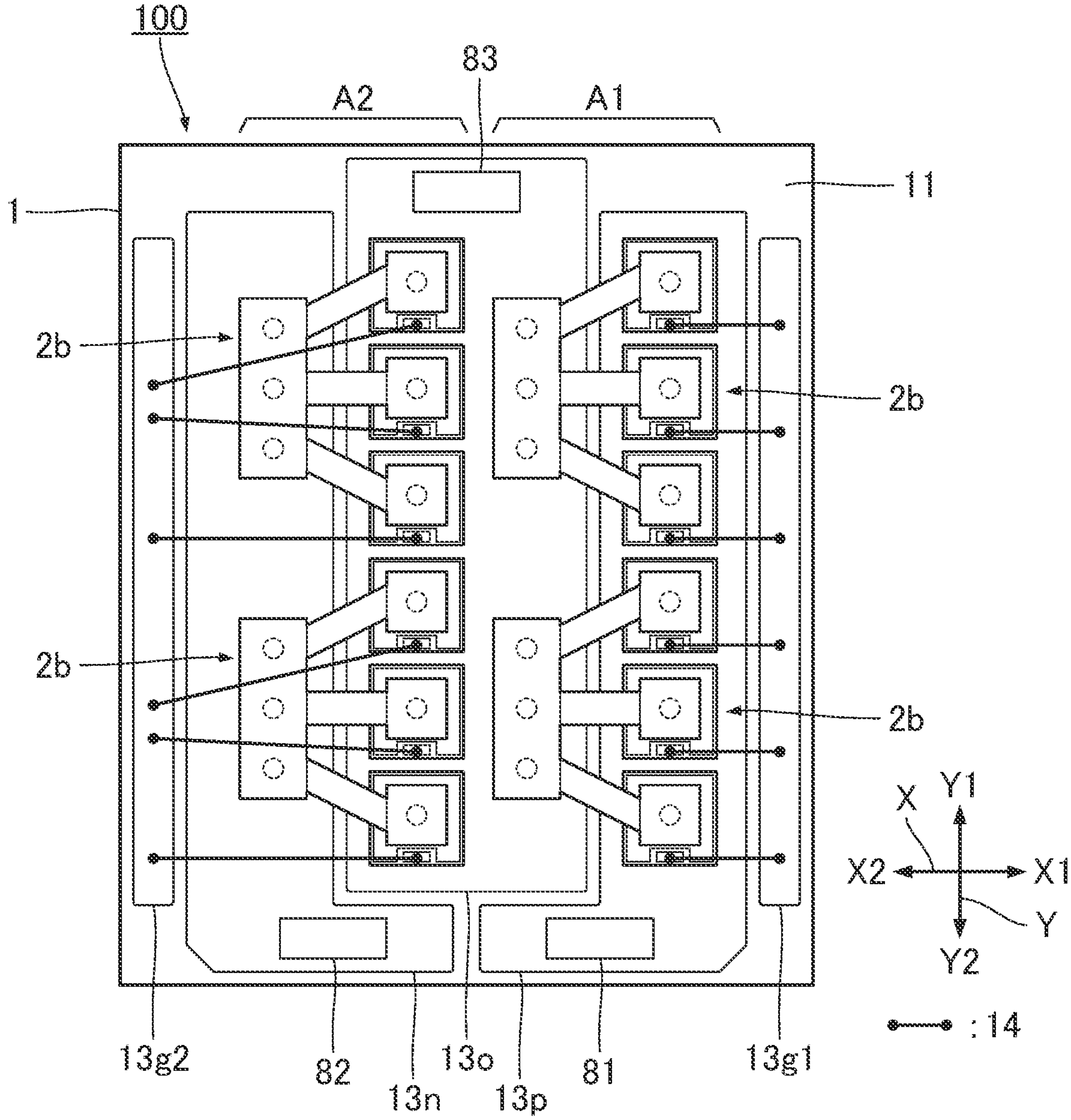
FIG. 9 is a plan view of the semiconductor module in Mode 2 of the third embodiment.

In Mode 2 illustrated in FIG. 9, each of the upper arm portion A1 and the lower arm portion A2 is constituted of two semiconductor units 2*b* described in the second embodiment. In a manner similar to Mode 1, each of the upper arm portion A1 and the lower arm portion A2 includes six semiconductor chips 4 connected in parallel to each other.

The first portion 51, the second portion 52, and the third portion 53 in each of the semiconductor units 2*b* of the upper arm portion A1 are joined to the conductive pattern 13*p*. The following are joined to the conductive pattern 13*o*: (i) the connection portion 50 in each of the semiconductor units 2*b* of the upper arm portion A1; and (ii) the first portion 51, the second portion 52, and the third portion 53 in each of the semiconductor units 2*b* of the lower arm portion A2. The connection portion 50 in each of the semiconductor units 2*b* in the lower arm portion A2 is joined to the conductive pattern 13*n*.

Mode 3

Figure 10:
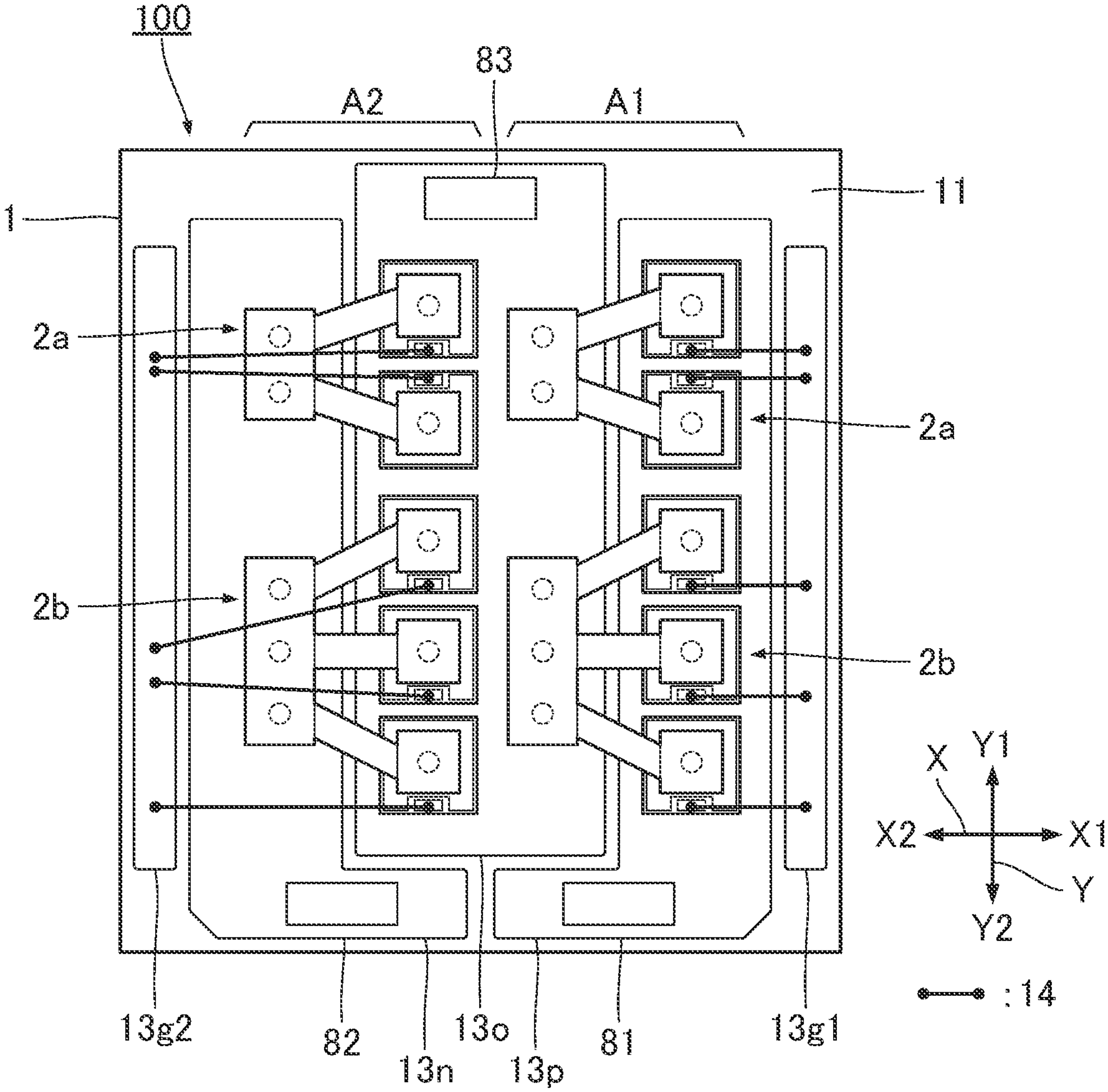
FIG. 10 is a plan view of the semiconductor module in Mode 3 of the third embodiment.

In Mode 3 illustrated in FIG. 10, each of the upper arm portion A1 and the lower arm portion A2 is constituted of one semiconductor unit 2*a* in the first embodiment and one semiconductor unit 2*b* in the second embodiment. Each of the upper arm portion A1 and the lower arm portion A2 includes five semiconductor chips 4 connected in parallel to each other.

The following are joined to the conductive pattern 13*p*: (i) the first portion 51 and the second portion 52 in the semiconductor unit 2*a*; and (ii) the first portion 51, the second portion 52, and the third portion 53 in the semiconductor unit 2b of the upper arm portion A1. The following are joined to the conductive pattern 13o: (i) the connection portions 50 in the semiconductor unit 2a and the semiconductor unit 2b of the upper arm portion A1; (ii) the first portion 51 and the second portion 52 in the semiconductor unit 2a of the lower arm portion A2; and (iii) the first portion 51, the second portion 52, and the third portion 53 in the semiconductor unit 2b of the lower arm portion A2. The connection portions 50 in the semiconductor unit 2a and the semiconductor unit 2b of the lower arm portion A2 are joined to the conductive pattern 13n.

Mode 4

Figure 11:
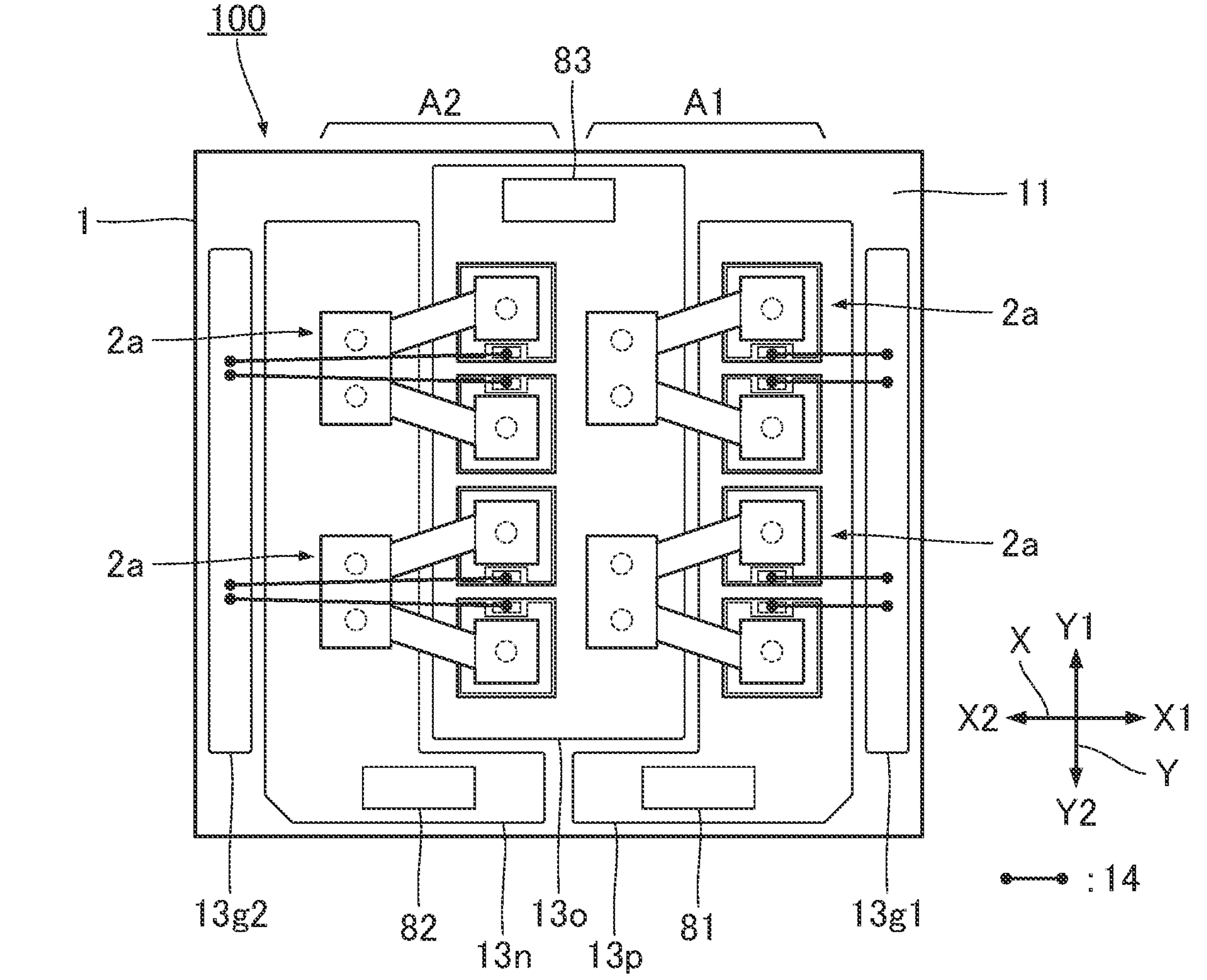
FIG. 11 is a plan view of the semiconductor module in Mode 4 of the third embodiment.

In Mode 4 illustrated in FIG. 11, each of the upper arm portion A1 and the lower arm portion A2 is constituted of two semiconductor units 2a. Each of the upper arm portion A1 and the lower arm portion A2 includes four semiconductor chips 4 connected in parallel to each other.

The first portion 51 and the second portion 52 in each of the semiconductor units 2a of the upper arm portion A1 are joined to the conductive pattern 13p. The following are joined to the conductive pattern 13o: (i) the connection portion 50 in each of the semiconductor units 2a of the upper arm portion A1; and (ii) the first portion 51 and the second portion 52 in each of the semiconductor units 2a of the lower arm portion A2. The connection portion 50 in each of the semiconductor units 2a of the lower arm portion A2 is joined to the conductive pattern 13n.

Mode 5

Figure 12:
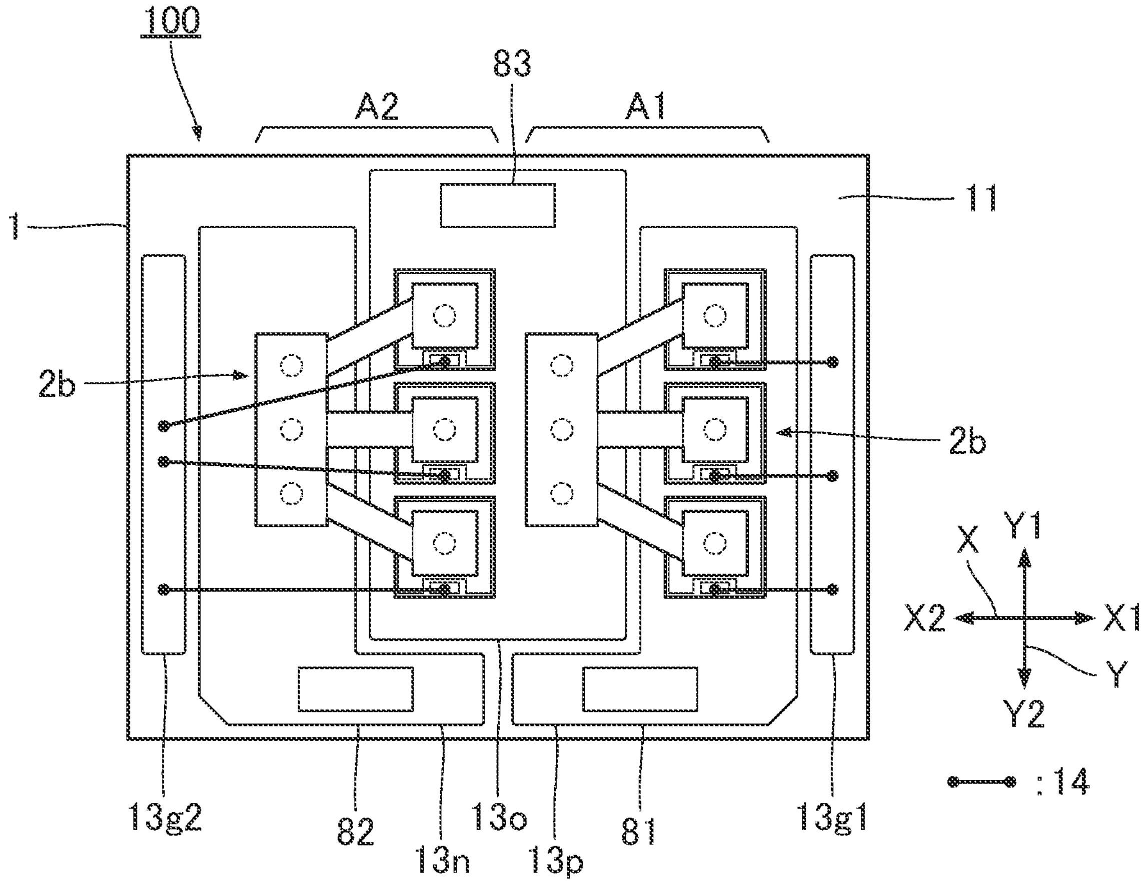
FIG. 12 is a plan view of the semiconductor module in Mode 5 of the third embodiment.

In Mode 5 illustrated in FIG. 12, each of the upper arm portion A1 and the lower arm portion A2 is constituted of one semiconductor unit 2b. Each of the upper arm portion A1 and the lower arm portion A2 includes three semiconductor chips 4 connected in parallel to each other.

The first portion 51, the second portion 52, and the third portion 53 in the semiconductor unit 2b of the upper arm portion A1 are joined to the conductive pattern 13p. The following are joined to the conductive pattern 13o: (i) the connection portion 50 in the semiconductor unit 2b of the upper arm portion A1; and (ii) the first portion 51, the second portion 52, and the third portion 53 in the semiconductor unit 2b of the lower arm portion A2. The connection portion 50 in the semiconductor unit 2b of the lower arm portion A2 is joined to the conductive pattern 13n.

Mode 6

Figure 13:
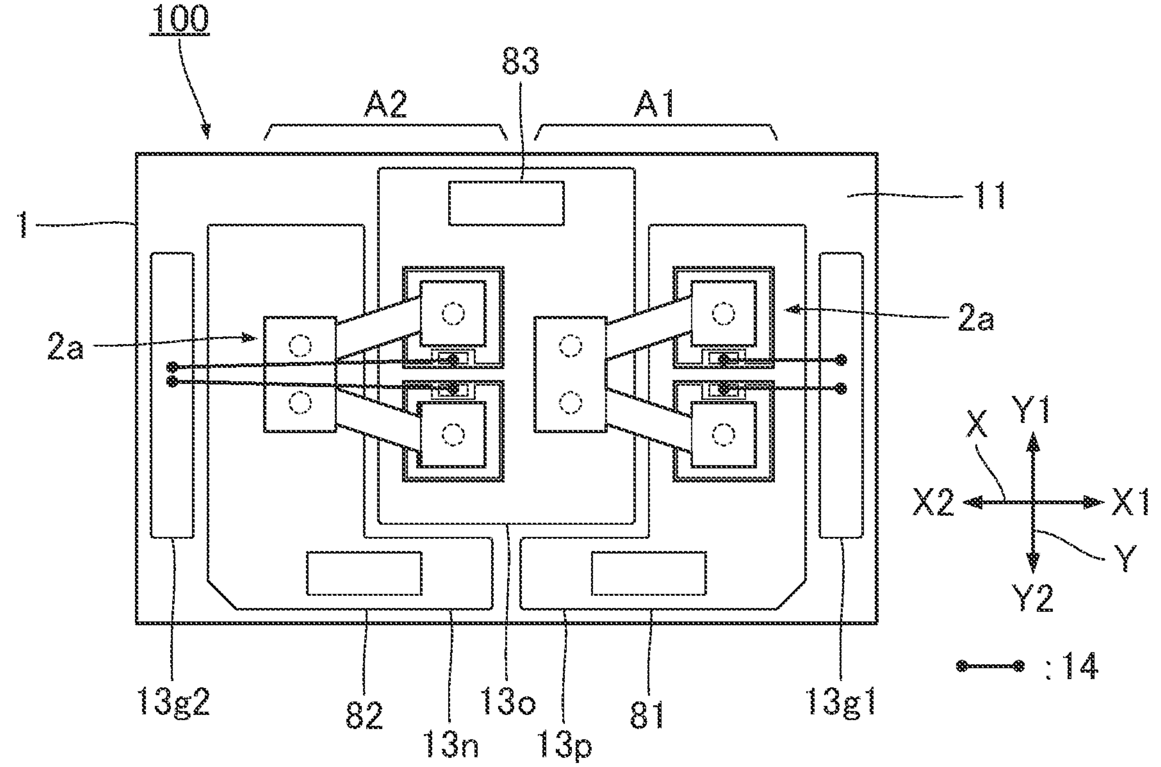
FIG. 13 is a plan view of the semiconductor module in Mode 6 of the third embodiment.

In Mode 6 illustrated in FIG. 13, each of the upper arm portion A1 and the lower arm portion A2 is constituted of one semiconductor unit 2a. Each of the upper arm portion A1 and the lower arm portion A2 includes two semiconductor chips 4 connected in parallel to each other.

The first portion 51 and the second portion 52 in the semiconductor unit 2a of the upper arm portion A1 are joined to the conductive pattern 13p. The following are joined to the conductive pattern 13o: (i) the connection portion 50 in the semiconductor unit 2a of the upper arm portion A1; and (ii) the first portion 51 and the second portion 52 in the semiconductor unit 2a of the lower arm portion A2. The connection portion 50 in the semiconductor unit 2a of the lower arm portion A2 is joined to the conductive pattern 13n.

D: Modifications

Specific modifications incorporated into the respective modes exemplified above are exemplified below. Two or more modes freely selected from the following exemplifications may be appropriately combined with each other in a range as long as there is no conflict. In the following explanations, focus is sometimes on the first protrusion 61 of the first portion 51 for the sake of convenience. Modifications related to the first protrusion 61 (the first portion 51) are also applicable to the second protrusion 62 (the second portion 52) and to the third protrusion 63 (the third portion 53).

(1) The shape of the wiring member 5 is not limited to the examples in the embodiments. The wiring member 5 having a shape illustrated in FIG. 14 or 15 may be adopted.

Figure 14:
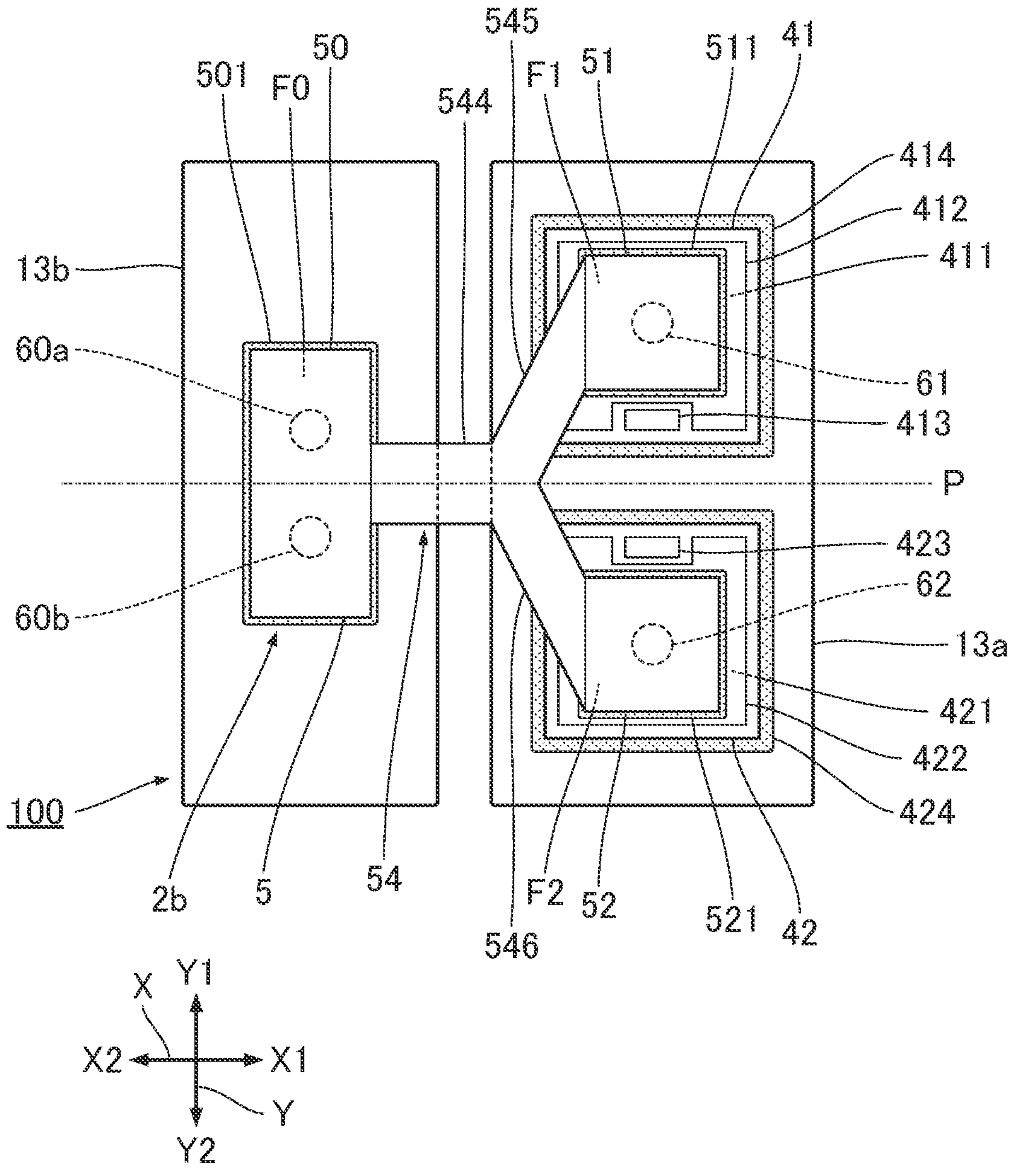
FIG. 14 is a plan view of a semiconductor module in a modification.

The coupling portion 54 in the wiring member 5 in FIG. 14 is formed into a Y-shape including a base portion 544, a first wiring portion 545, and a second wiring portion 546. The base portion 544 linearly extends in the X1 direction from the connection portion 50. The first wiring portion 545 couples an end of the base portion 544 in the X1 direction to the first portion 51. The second wiring portion 546 couples the end of the base portion 544 in the X1 direction to the second portion 52. The first wiring portion 545 and the second wiring portion 546 are inclined with respect to the symmetry plane P in plan view. Thus, the wiring portion 5 in FIG. 14 has a planar shape branching into two directions along the way in the X1 direction from the connection portion 50.

Figure 15:
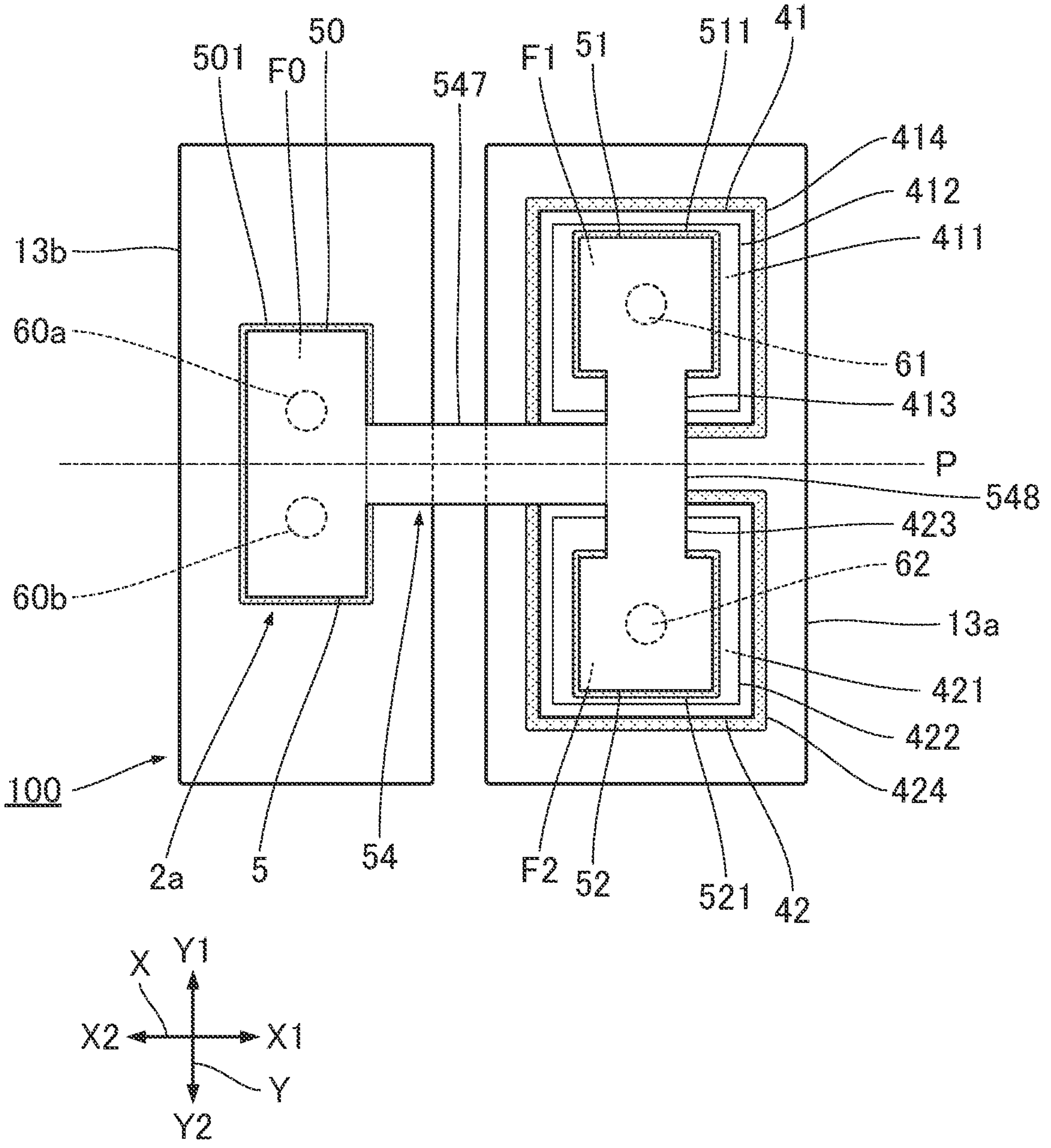
FIG. 15 is a plan view of the semiconductor module in the modification.

The coupling portion 54 in the wiring member 5 in FIG. 15 is formed into a T-shape including a base portion 547 and a wiring portion 548. The base portion 547 linearly extends in the X1 direction from the connection portion 50. The wiring portion 548 linearly extends in the Y-axis direction over the first portion 51 and the second portion 52. The base portion 547 is coupled to the center of the wiring portion 548. Thus, the wiring member 5 shown in FIG. 15 has a planar shape branching into two directions from a portion extending in the X1 direction from the connection portion 50.

The wiring members 5 in FIGS. 14 and 15 have axisymmetric shapes in plan view, in a manner similar to the wiring members 5 in the first embodiment and the second embodiment. The wiring members 5 in FIGS. 14 and 15 have three-dimensional shapes that are plane-symmetric across the symmetry plane P, in a manner similar to the wiring members 5 in the first embodiment and the second embodiment.

In FIGS. 14 and 15, there is a possibility that currents flowing through the semiconductor chips 4 will be concentrated on a branched part of the coupling portion 54. In one example in FIG. 14, the currents are concentrated on a place at which the base portion 544, the first wiring portion 545, and the second wiring portion 546 intersect in the wiring member 5. In one example in FIG. 15, the currents are concentrated on a place at which the base portion 547 and the wiring portion 548 intersect in the wiring member 5. Heat may be generated due to concentration of the currents.

In the first embodiment, in contrast to the modes in FIGS. 14 and 15, the following (i) and (ii) are coupled to the connection portion 50 at the positions spaced apart from each other: (i) the first wiring portion 541 that couples the connection portion 50 to the first portion 51; and (ii) the second wiring portion 542 that couples the connection portion 50 to the second portion 52. As a result, as compared to the modes in FIGS. 14 and 15, concentration of currents is reduced and generation of excessive heat in the semiconductor module 100 is therefore suppressed. The same holds for the second embodiment. From the viewpoint of suppressing heat generation, the first embodiment or the second embodiment is more effective than the mode illustrated in FIG. 14 or 15.

A coating (hereinafter, "foundation film") for improving adhesion of the sealing material 3 is sometimes formed on the exterior surface (the upper surface and the side surface) of the semiconductor chip 4 and the upper surface of the mounting board 1. In a process before formation of the sealing material 3, whether the formation state of the foundation film is appropriate (e.g., whether there is a defect) is examined. Since a space below (in the Z1 direction) the wiring member 5 is hidden behind the wiring member 5, it is difficult to examine the formation state of the foundation film. In the first embodiment, since the first wiring portion 541 and the second wiring portion 542 are spaced apart from each other, the area in which the wiring member 5 overlaps the semiconductor chips 4 is reduced relative to the mode in FIG. 14 or 15. As a result, the formation state of the foundation film in each of the semiconductor chips 4 can be easily confirmed from the outside. The same holds true for the second embodiment.

(2) In the foregoing embodiments, examples are given in which the shape and dimension are the same in the connecting protrusions 60 of the connection portion 50, the first protrusion 61, the second protrusion 62, and the third protrusion 63. However, the shape or dimension of the connecting protrusions 60 may be different from the shape or dimension of the first protrusion 61, the second protrusion 62, and the third protrusion 63.

To firmly join the first portion 51 of the wiring portion 5 to the semiconductor chip 4, a sufficient area of the first joining material 511 needs to be secured. From the viewpoint of absorbing stress acting on the first portion 51 by means of the first joining material 511, it is important to secure a sufficient area of the first joining material 511. As to the first portion 51 of the wiring member 5, securing a sufficient area of the first joining material 511 is prioritized. As to the connection portion 50 of the wiring member 5, the area of the joining material 501 is easier to secure as compared to the first portion 51. However, stabilizing the orientation of the wiring member 5 with the connecting protrusions 60 is prioritized. As described above, it is envisaged that the technical effect to be prioritized differs between the connecting protrusions 60 and the first protrusion 61.

According to an example of the case in which the shape or dimension differs between the connecting protrusions 60 and the first protrusion 61, the following (i) and (ii) can be adopted independently of each other: (i) a preferred shape or dimension for the connecting protrusions 60; and (ii) a preferred shape or dimension for the first protrusion 61 or the second protrusion 62. For example, a shape or dimension of the connecting protrusions 60 can be selected to obtain an effect required for the connecting protrusions 60. Furthermore, a shape or dimension of the first protrusion 61 can be selected to obtain an effect required for the first protrusion 61. Specific modes of the connecting protrusions 60 and the first protrusion 61 are described below.

Figure 16:
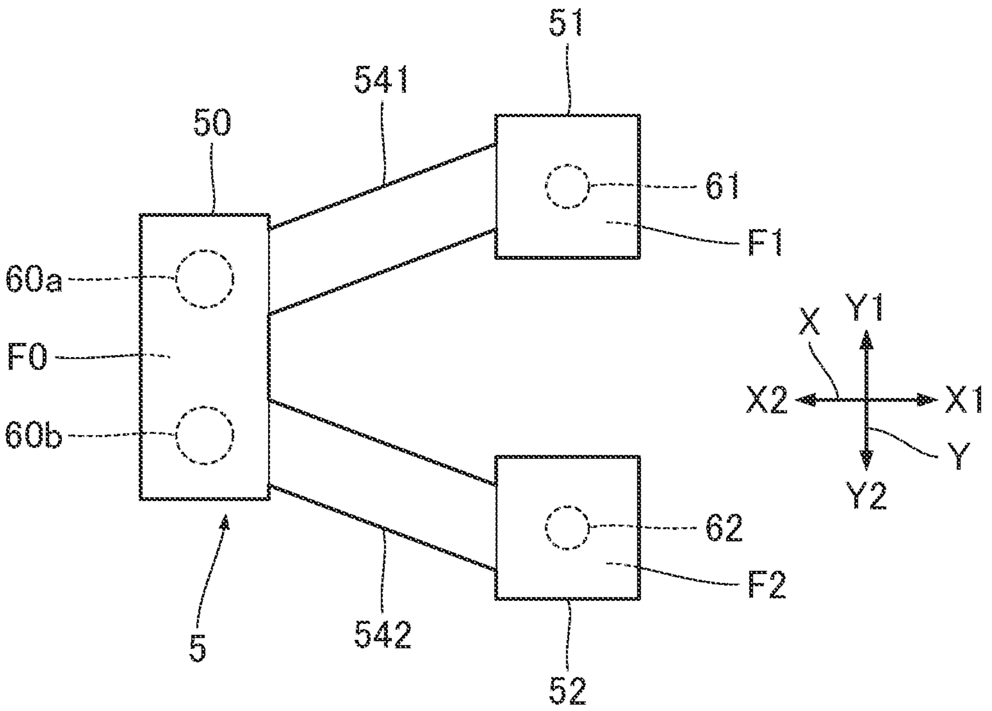
FIG. 16 is a plan view of a wiring member in the modification.
Figure 17:
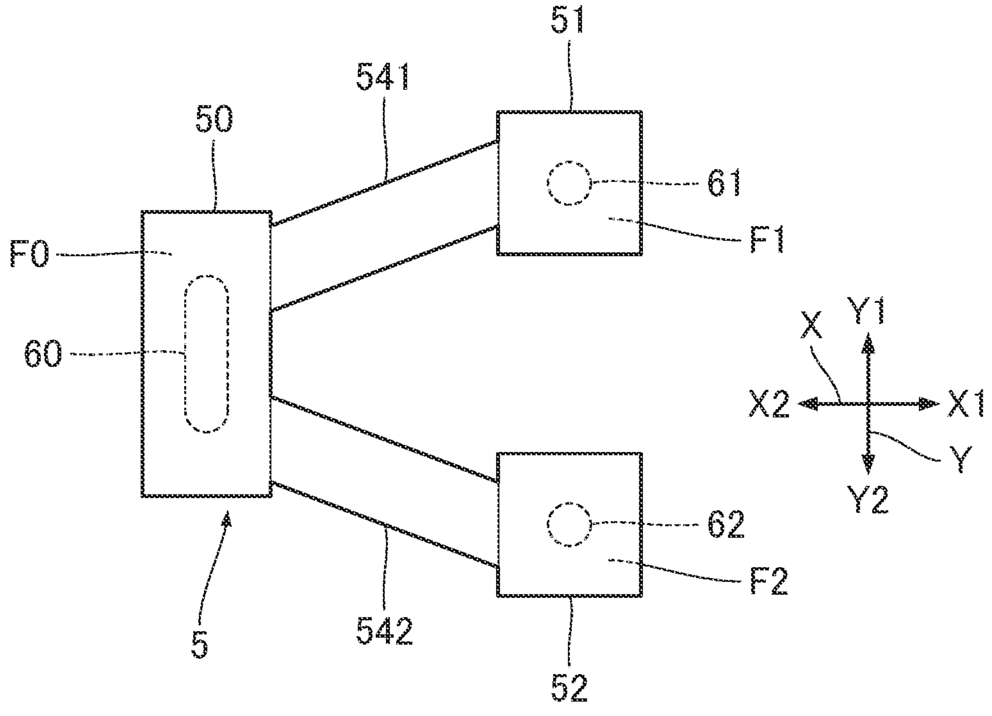
FIG. 17 is a plan view of the wiring member in the modification.
Figure 18:
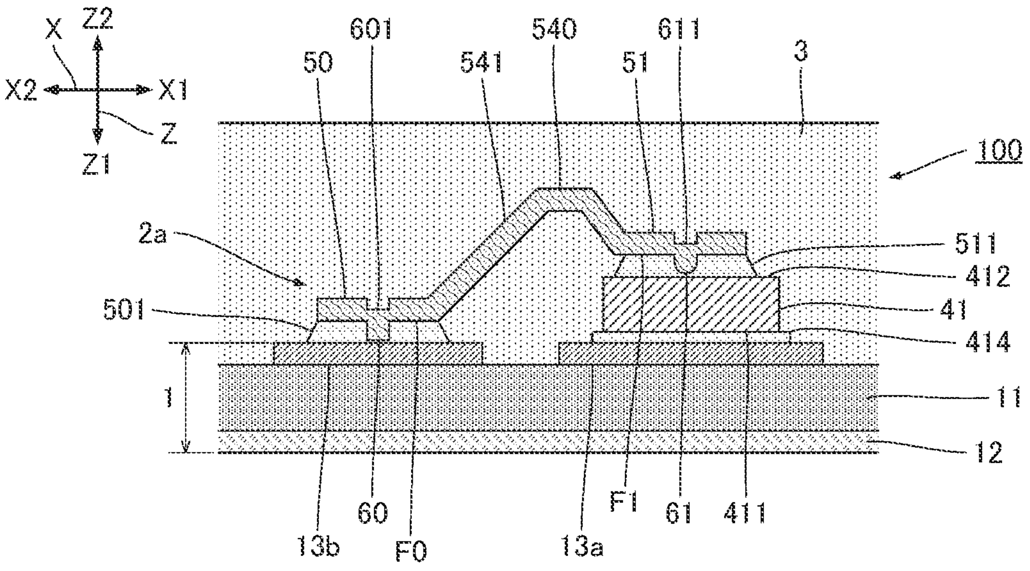
FIG. 18 is a sectional view of the semiconductor module in the modification.

In an example of FIG. 16, the diameters of the first protrusion 61 and the second protrusion 62 are smaller than the diameter of the connecting protrusions 60 (**60*a* and 60*b*). In an example of FIG. 17, the sectional shapes of the first protrusion 61 and the second protrusion 62 are circles. The sectional shape of the connecting protrusion 60 is an elongated circle or ellipse that is elongated in the Y-axis direction. In an example of FIG. 18, the tips of the connecting protrusions 60 are flat surfaces. The tips of the first protrusion 61 and the second protrusion 62 are curved surfaces (e.g., spherical surfaces). According to examples of FIGS. 16 to 18, the orientation of the wiring member 5 can be stably maintained by the connecting protrusions 60 while sufficient areas are secured for the first joining material 511 and the second joining material 521**.

Figure 19:
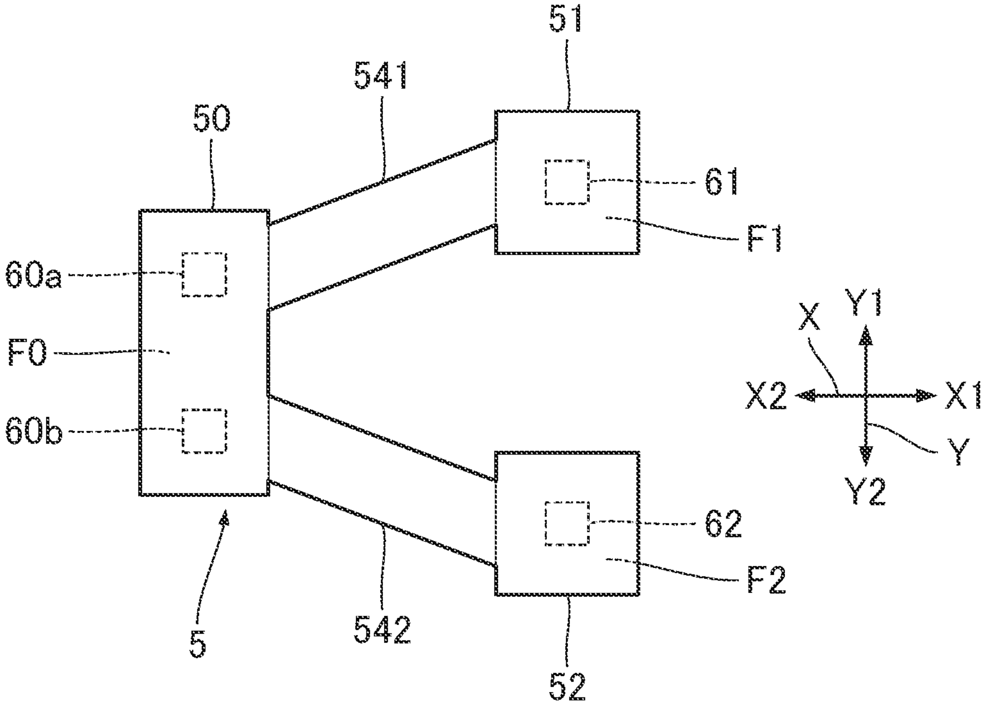
FIG. 19 is a plan view of the wiring member in the modification.

(3) In the foregoing embodiments, examples are given in which the connecting protrusions 60 and the first protrusion 61 have columnar shapes. However, the shapes of the connecting protrusion 60 and the first protrusion 61 are not limited to the examples. For example, as illustrated in FIG. 19, it is envisaged that the connecting protrusions 60 may have a prismatic columnar shape (e.g., a rectangular columnar shape). Alternatively, it is envisaged that the first protrusion 61 may have a prismatic columnar shape (e.g., a rectangular columnar shape). The connecting protrusions 60 or the first protrusion 61 may have a truncated cone shape or a truncated pyramid shape.

Figure 20:
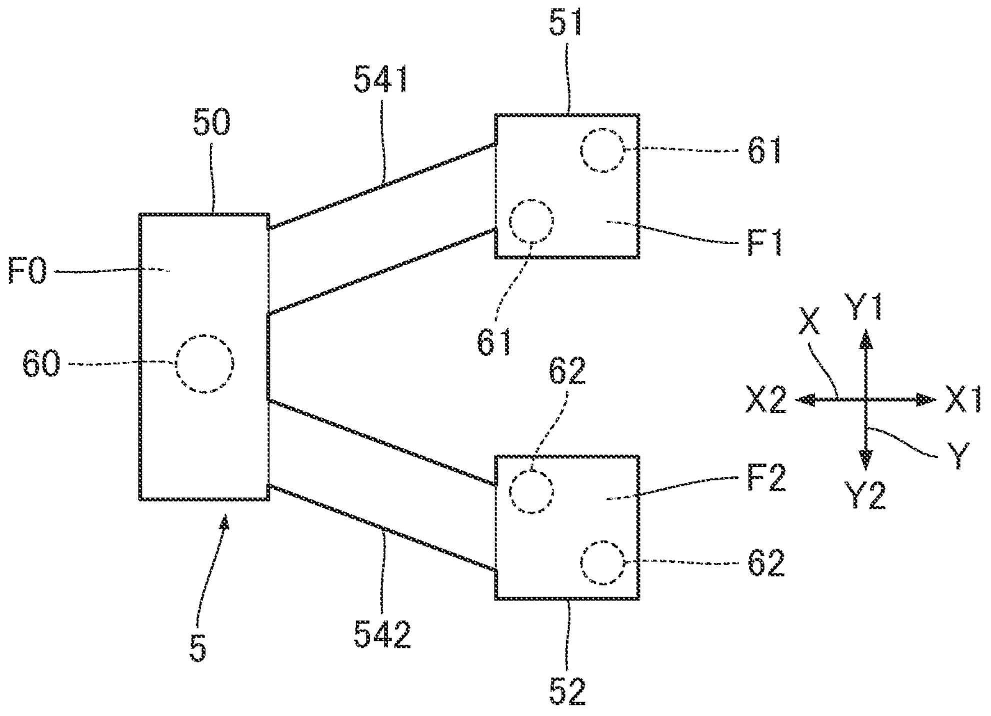
FIG. 20 is a plan view of the wiring member in the modification.

(4) In the foregoing embodiments, examples are given in which two connecting protrusions 60 (**60*a* and 60*b*) are formed on the connection portion 50 and one first protrusion 61 is formed on the first portion 51. However, the number of the connecting protrusions 60 and the number of the first protrusion 61 are not limited to the examples. For example, as illustrated in FIG. 20, it is envisaged that one connecting protrusion 60 is formed on the connection portion 50. Alternatively, it is envisaged that first protrusions 61 are formed on the first portion 51**.

Figure 21:
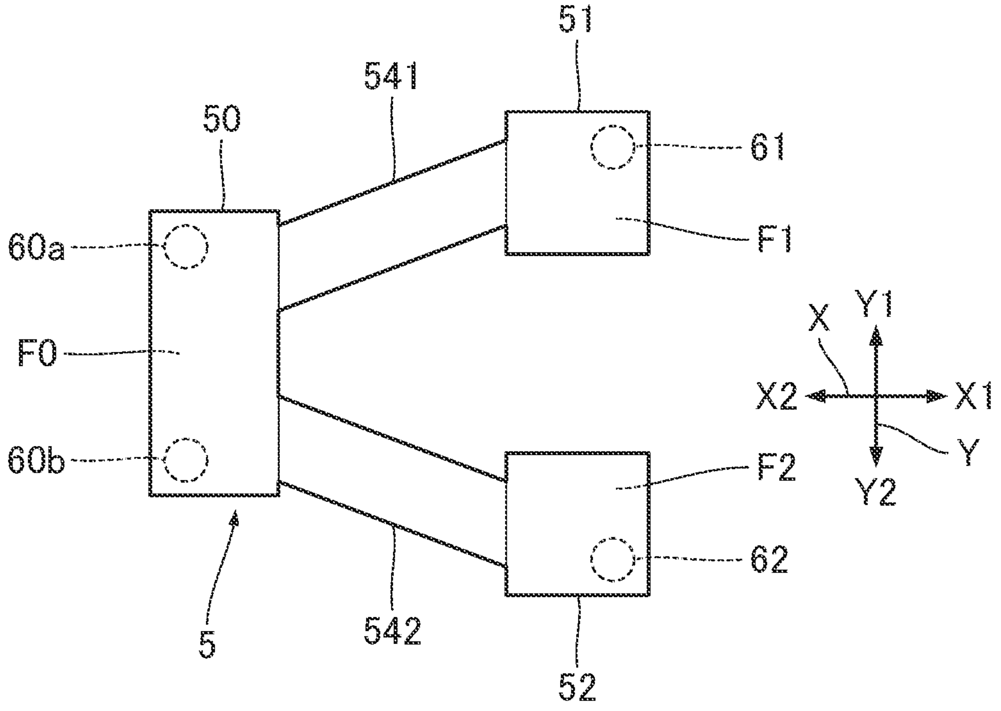
FIG. 21 is a plan view of the wiring member in the modification.

(5) The following are not limited to examples in the foregoing embodiments: the positions at which the connecting protrusions 60 are formed on the connection portion 50; and the position at which the first protrusion 61 is formed on the first portion 51. For example, as illustrated in FIG. 21, the connecting protrusions 60 (**60*a* and 60*b*) may be positioned near corners of the connection surface F0. In the foregoing embodiments, examples are given in which the first protrusion 61 is formed at the center of gravity of the first connection surface F1. However, the first protrusion 61 may be positioned near a corner of the first connection surface F1 as illustrated in FIG. 21**.

(6) In the First Embodiment, an example is given in which the semiconductor chip 41 and the semiconductor chip 42 are mounted on the single conductive pattern **13*a*. However, the semiconductor chip 41 and the semiconductor chip 42 may be joined to conductive patterns 13 that differ from each other. Similarly, the semiconductor chip 41, the semiconductor chip 42, and the semiconductor chip 43 may be joined to conductive patterns 13** that differ from each other in the second embodiment. Thus, a "conductive pattern" in the present disclosure may be constituted of a single pattern or by multiple patterns.

(7) In the foregoing embodiments, an example is given of the semiconductor chip 4, which is a MOSFET in which SiC is used as a semiconductor material. However, the semiconductor chip 4 is not limited thereto. For example, an IGBT (Insulated Gate Bipolar Transistor), an FWD (Freewheeling Diode, Flyback Diode), an RC-IGBT (Reverse Conducting IGBT), or an SBD (Schottky Barrier Diode) may be used as the semiconductor chip 4. In an example in which an IGBT is adopted as the semiconductor chip 4, the main electrode 411 is a collector electrode and the main electrode 412 is an emitter electrode.

(8) The descriptions "nth" (n is a natural number) in the present application are merely used as formal and expedient indicators (labels) for distinguishing elements in the descriptions and do not have any substantive meanings. The understanding of the positions of elements is not to be limited, nor is the order of manufacturing thereof, or the like, based the descriptions "nth."

E: Appendices

The following configurations are derived from the foregoing description.

A semiconductor module according to one aspect (Aspect 1) of the present disclosure includes: a first semiconductor chip including a first main electrode; a second semiconductor chip including a second main electrode; a conductive pattern; and a wiring member. The wiring member includes (i) a connection portion including a connection surface opposing the conductive pattern, (ii) a first portion including a first connection surface opposing the first main electrode, (iii) a second portion including a second connection surface opposing the second main electrode, (iv) a coupling portion coupling the connection portion, the first portion, and the second portion to one another, (v) a connecting protrusion protruding from the connection surface toward the conductive pattern, (vi) a first protrusion protruding from the first connection surface toward the first main electrode, and (vii) a second protrusion protruding from the second connection surface toward the second main electrode. The conductive pattern and the connection surface are joined to each other by a joining material between the conductive pattern and the connection surface. The first main electrode and the first connection surface are joined to each other by a first joining material between the first main electrode and the first connection surface. The second main electrode and the second connection surface are joined to each other by a second joining material between the second main electrode and the second connection surface.

In this aspect, the following are provided on the wiring member: (i) the connecting protrusion protruding toward the conductive pattern; (ii) the first protrusion protruding toward the first main electrode; and (iii) the second protrusion protruding toward the second main electrode. Thus, the wiring member is supported at three or more points. As a result, even when the number of the first protrusion or the second protrusion is small, the orientation of the wiring member is stably maintained. The probability of inclination of the wiring member with respect to a desired orientation can be decreased, and the thicknesses of the joining materials not being uniform caused by inclination of the wiring member can be suppressed.

In an example (Aspect 2) according to Aspect 1, the wiring member has an axisymmetric shape in plan view.

According to this aspect, since the wiring member has an axisymmetric shape, the orientation of the wiring member is more likely to be stably maintained than in a case in which the wiring member has an asymmetric shape. As a result, the effect that the thicknesses of the joining materials not being uniform caused by inclination of the wiring member can be suppressed is significantly prominent.

In an example (Aspect 3) according to Aspect 1 or 2, the wiring member has a plane-symmetric shape across a symmetry plane.

According to this aspect, since the shape of the wiring member is plane-symmetric, the center of gravity of the wiring member is positioned on the symmetry plane. As a result, the orientation of the wiring member is more likely to be stably maintained than in a case in which the wiring member has an asymmetric shape. The effect that the thicknesses of the joining materials not being uniform caused by inclination of the wiring member can be suppressed is significantly prominent.

In an example (Aspect 4) according to any one of Aspects 1 to 3, the coupling portion includes a first wiring portion coupling the connection portion and the first portion to each other, and a second wiring portion coupling the connection portion and the second portion to each other. The first wiring portion and the second wiring portion are coupled to the connection portion at positions spaced apart from each other.

According to this aspect, the following (i) and (ii) are coupled to the connection portion at positions spaced apart from each other: (i) the first wiring portion that couples the connection portion to the first portion, and (ii) the second wiring portion that couples the connection portion to the second portion. As a result, as compared to a configuration in which the first wiring portion and the second wiring portion are coupled to each other, concentration of currents in the wiring member is reduced. In addition, generation of excessive heat in the semiconductor module can thereby be suppressed. Furthermore, the area in which the wiring member overlaps the first semiconductor chip or the second semiconductor chip is decreased, as compared to a case (a T-shape) in which the wiring member is constituted of two wiring portions, a first wiring portion that couples the first portion to the second portion, and a second wiring portion that couples the first wiring portion to a connection portion. For this reason, the state of the first semiconductor chip or the second semiconductor chip can be easily confirmed from the outside.

In an example (Aspect 5) according to any one of Aspects 1 to 4, the wiring member further includes a plurality of connecting protrusions including the connecting protrusion. The plurality of connecting protrusions are provided on the connection surface.

In this aspect, since the connecting protrusions are provided on the connection surface, the orientation of the wiring member is more likely to be stably maintained than in a case in which only one connecting protrusion is provided on the connection surface. As a result, the effect that the thicknesses of the joining materials not being uniform caused by inclination of the wiring member can be suppressed is significantly prominent.

In an example (Aspect 6) according to Aspect 5, the connection portion has a planar shape that is elongated in a first direction in which the first semiconductor chip and the second semiconductor chip are arranged. The connecting protrusions are arranged spaced apart from each other in the first direction.

According to this aspect, the connecting protrusions are arranged spaced apart from each other in the longitudinal direction (the first direction) of the connection portion. As a result, the orientation of the wiring member is more likely to be stably maintained than in a configuration in which connecting protrusions are arranged in a direction orthogonal to the first direction. The effect that the thicknesses of the joining materials not being uniform caused by inclination of the wiring member can be suppressed is significantly prominent.

In an example (Aspect 7) according to any one of Aspects 1 to 6, the first protrusion is formed on the first connection surface. The second protrusion is formed on the second connection surface.

According to this aspect, one first protrusion is formed on the first connection surface, and one second protrusion is formed on the second connection surface. As a result, the area for joining by the joining materials (the first joining material and the second joining material) can be more easily secured even when the first semiconductor chip or the second semiconductor chip is small, as compared to the following cases (i) and (ii): (i) first protrusions are formed on the first connection surface; and (ii) second protrusions are formed on the second connection surface.

In an example (Aspect 8) according to any one of Aspects 1 to 7, the semiconductor module further includes a third semiconductor chip including a third main electrode. The wiring member includes a third portion including a third connection surface opposing the third main electrode, and a third protrusion protruding from the third connection surface toward the third main electrode. The third main electrode and the third connection surface are joined to each other by a third joining material between the third main electrode and the third connection surface.

According to this aspect, since three semiconductor chips are connected in parallel, a larger current can be controlled than in a case in which two semiconductor chips are connected in parallel.

In an example (Aspect 9) according to any one of Aspects 1 to 8, a shape of the connecting protrusion differs from that of each of the first protrusion and the second protrusion. Alternatively, in an example (Aspect 10) according to any one of Aspects 1 to 8, a dimension of the connecting protrusion differs from that of each of the first protrusion and the second protrusion.

According to these aspects, the following (i) and (ii) can be adopted independently of each other: (i) a preferred shape or dimension for the connecting protrusions; and (ii) a preferred shape or dimension for the first protrusion or the second protrusion.

DESCRIPTION OF REFERENCE SIGNS

100 . . . semiconductor module, 1 . . . mounting board, 11 . . . insulating substrate, 12 . . . metallic layer, 13 (13*a*, 13*b*, 13*p*, 13*n*, 13*o*) . . . conductive pattern, 13*g*1, 13*g*2 . . . control wiring, 2*a*, 2*b* . . . semiconductor unit, 3 . . . sealing material, 4 (41, 42, 43) . . . semiconductor chip, 411, 421, 431, 412, 422, 432 . . . main electrode, 413, 423, 433 . . . control electrode, 414, 424, 434 . . . joining material, 5 . . . wiring member, 50 . . . connection portion, 501 . . . joining material, 51 . . . first portion, 511 . . . first joining material, 52 . . . second portion, 521 . . . second joining material, 53 . . . third portion, 531 . . . third joining material, 54 . . . coupling portion, 540 . . . top portion, 541, 545 . . . first wiring portion, 542, 546 . . . second wiring portion, 543 . . . third wiring portion, 544, 547 . . . base portion, 548 . . . wiring portion, 60 . . . connecting protrusion, 61 . . . first protrusion, 62 . . . second protrusion, 63 . . . third protrusion.

What is claimed is:

1. A semiconductor module comprising:
a first semiconductor chip including a first main electrode;
a second semiconductor chip including a second main electrode;
a conductive pattern; and
a wiring member, wherein:
the wiring member includes:
a connection portion including a connection surface opposing the conductive pattern;
a first portion including a first connection surface opposing the first main electrode;
a second portion including a second connection surface opposing the second main electrode;
a coupling portion coupling the connection portion, the first portion, and the second portion to one another, the coupling portion includes
a first wiring portion coupling the connection portion and the first portion to each other; and
a second wiring portion coupling the connection portion and the second portion to each other,
the first wiring portion and the second wiring portion are coupled to the connection portion at positions that are spaced apart from each other on the connection portion;
a connecting protrusion protruding from the connection surface toward the conductive pattern;
a first protrusion protruding from the first connection surface toward the first main electrode; and
a second protrusion protruding from the second connection surface toward the second main electrode,
the conductive pattern and the connection surface are joined to each other by a joining material between the conductive pattern and the connection surface,
the first main electrode and the first connection surface are joined to each other by a first joining material between the first main electrode and the first connection surface, and
the second main electrode and the second connection surface are joined to each other by a second joining material between the second main electrode and the second connection surface.

2. The semiconductor module according to claim 1, wherein the wiring member has an axisymmetric shape in plan view.

3. The semiconductor module according to claim 1, wherein the wiring member has a plane-symmetric shape across a symmetry plane.

4. The semiconductor module according to claim 1, wherein:
the connecting protrusion is a first connecting protrusion,
the wiring member further includes a second connecting protrusion,
the first connecting protrusion and the second connecting protrusion are provided on the connection surface.

5. The semiconductor module according to claim 4, wherein:
the connection portion has a planar shape that is elongated in a first direction in which the first semiconductor chip and the second semiconductor chip are arranged, and
the first connecting protrusion and the second connecting protrusion are arranged spaced apart from each other in the first direction.

6. The semiconductor module according to claim 5, wherein:
the first protrusion is formed on the first connection surface, and
the second protrusion is formed on the second connection surface.

7. The semiconductor module according to claim 1, further comprising a third semiconductor chip including a third main electrode, wherein:
the wiring member further includes:
a third portion including a third connection surface opposing the third main electrode; and a third protrusion protruding from the third connection surface toward the third main electrode, and the third main electrode and the third connection surface are joined to each other by a third joining material between the third main electrode and the third connection surface.

8. The semiconductor module according to claim 1, wherein a shape of the connecting protrusion differs from that of each of the first protrusion and the second protrusion.

9. The semiconductor module according to claim 1, wherein a dimension of the connecting protrusion is differs from that of each of the first protrusion and the second protrusion.

10. The semiconductor module according to claim 5, wherein the first connecting protrusion is positioned near an end of the first wiring portion, and the second connecting protrusion is positioned near an end of the second wiring portion.

11. The semiconductor module according to claim 1, wherein:

the first wiring portion has an end coupled to the connection portion, the second wiring portion has an end coupled to the connection portion, and the end of the first wiring portion and the end of the second wiring portion are spaced apart from each other with a distance.

12. The semiconductor module according to claim 1, wherein:

the first semiconductor chip and the second semiconductor chip are arranged in a first direction, and a distance between the first wiring portion and the second wiring portion in the first direction increases as a distance from the connection portion increases in a second direction perpendicular to the first direction.

* * * * *